(12) United States Patent
Striegel

(10) Patent No.: US 9,400,856 B2
(45) Date of Patent: Jul. 26, 2016

(54) SYSTEM AND METHOD FOR GENERATING A LIGHTING PLAN

(76) Inventor: Marc Striegel, Altadena, CA (US)

(*) Notice: Subject to any disclaimer, the term of this patent is extended or adjusted under 35 U.S.C. 154(b) by 997 days.

(21) Appl. No.: 13/472,705

(22) Filed: May 16, 2012

(65) Prior Publication Data

US 2013/0311143 A1  Nov. 21, 2013

(51) Int. Cl.
G06F 17/50 (2006.01)

(52) U.S. Cl.
CPC .................. G06F 17/5009 (2013.01)

(58) Field of Classification Search
CPC .. G06F 17/50; G06F 17/5004; G06F 17/5009
USPC ............................................................ 703/1
See application file for complete search history.

(56) References Cited

U.S. PATENT DOCUMENTS

| 7,118,498 | B2 | 10/2006 | Meadows et al. | |
|---|---|---|---|---|
| 7,373,244 | B2 | 5/2008 | Kreft | |
| 2005/0251331 | A1* | 11/2005 | Kreft | 701/207 |
| 2006/0022214 | A1* | 2/2006 | Morgan | F21K 9/00 257/99 |
| 2010/0277295 | A1* | 11/2010 | Matthews et al. | 340/332 |
| 2010/0309016 | A1* | 12/2010 | Wendt et al. | 340/825.22 |
| 2011/0077925 | A1 | 3/2011 | Vander Griend | |
| 2011/0115413 | A1* | 5/2011 | Erickson et al. | 315/312 |
| 2012/0078667 | A1 | 3/2012 | Denker et al. | |
| 2012/0323382 | A1* | 12/2012 | Kamel | G05F 1/66 700/286 |
| 2014/0028216 | A1* | 1/2014 | Wang et al. | 315/294 |

OTHER PUBLICATIONS

Fairfield et al., Traffic Light Mapping and Detection. 2011 (6 pages).*

* cited by examiner

Primary Examiner — Kamini S Shah
Assistant Examiner — Andre Pierre Louis
(74) Attorney, Agent, or Firm — Inventive Patent Law P.C.; Jim H. Salter

(57) ABSTRACT

A system and method for enabling users to generate a lighting plan is disclosed. A particular embodiment includes obtaining map data from a mapping source, the map data enabling generation of a map at a location of interest; obtaining lamp data, the lamp data including lamp specification data including parameters corresponding to attributes of lamps of a plurality of lamps; using a data processor to provide a user interface with which a user can perform a graphical drag-and-drop operation to select a first lamp from among the plurality of lamps and position the first lamp in a position on the map; and generating a lighting plan based on the attributes and position of the first lamp.

21 Claims, 25 Drawing Sheets

Figure 17

SYSTEM AND METHOD FOR GENERATING A LIGHTING PLAN

TECHNICAL FIELD

This patent application relates to computer-implemented software systems, according to one embodiment, and more specifically to using an electronic system for generating a lighting plan.

COPYRIGHT

A portion of the disclosure of this patent document contains material that is subject to copyright protection. The copyright owner has no objection to the facsimile reproduction of the patent document or the patent disclosure, as it appears in the Patent and Trademark Office patent files or records, but otherwise reserves all copyright rights whatsoever. The following notice applies to the software and data as described below and in the drawings that form a part of this document: Copyright 2011-2012 Marc Striegel, All Rights Reserved.

BACKGROUND

It is often necessary for lighting specialists, building contractors, architects, designers, and the like to determine how to provide lighting for a particular location, whether the location is an exterior or interior location. For example, a designer may need to determine how to light a new parking lot. Traditionally, the designer would visit the location, walk the perimeter, hand draw the location, and hand mark the locations where the designer would suggest that lighting elements be installed in the parking lot location. Unfortunately, these hand drawings are not accurate, are not easily conveyed to others, and do not include detailed costing information necessary for an informative estimate or proposal. Typically, the designer would have to take the hand drawn map back to an office and apply the details of the particular lighting elements to generate a rough cost estimate. These traditional methods of developing lighting plans and estimates/proposals are inaccurate, time-consuming, and inefficient.

SUMMARY

In various example embodiments, a system and method for enabling users to generate a lighting plan is disclosed. The system provides a tool for the lighting industry, contractors, builders, architects, designers, and the like for mapping a region with lighting elements, developing a lighting plan, and delivering real time quotes from the field electronically on tablets, laptops or personal computers (PCs). The process of creating a single quote or multiple quotes is radically streamlined allowing for quote turnaround in minutes instead of hours or days. In one embodiment, the hand-held quoting tool supports quick and easy lot dimensioning with a drag and drop inventory selection interface. The tool can produce a printable and editable lot lighting map and plan for review and revision. Front line salespeople can use the tool to seamlessly link to their sales system and product inventory online. The various embodiments described herein can replace traditional methods of drawing maps and doing energy audits of a client's current state by hand and writing estimates and proposals on clipboards.

BRIEF DESCRIPTION OF THE DRAWINGS

The various embodiments is illustrated by way of example, and not by way of limitation, in the figures of the accompanying drawings in which:

FIG. 17 illustrates an example embodiment of a portion of a lighting plan proposal or spreadsheet produced by the lighting plan development system of an example embodiment;

DETAILED DESCRIPTION

In the following description, for purposes of explanation, numerous specific details are set forth in order to provide a thorough understanding of the various embodiments. It will be evident, however, to one of ordinary skill in the art that the various embodiments may be practiced without these specific details.

In the various embodiments described herein, a system and method for enabling users to generate a lighting plan is disclosed. In various embodiments, a software application program is used to enable the development of a lighting plan or proposal and to simulate the effects of the lighting plan or proposal on the display screen of a computer system. As described in more detail below, the computer or computing system on which the described embodiments can be implemented can include personal computers (PCs), portable computing devices, laptops, tablet computers, personal digital assistants (PDAs), personal communication devices (e.g., cellular telephones, smartphones, or other wireless devices), network computers, set-top boxes, consumer electronic devices, or any other type of computing, data processing, communication, networking, or electronic system.

Figure 1:
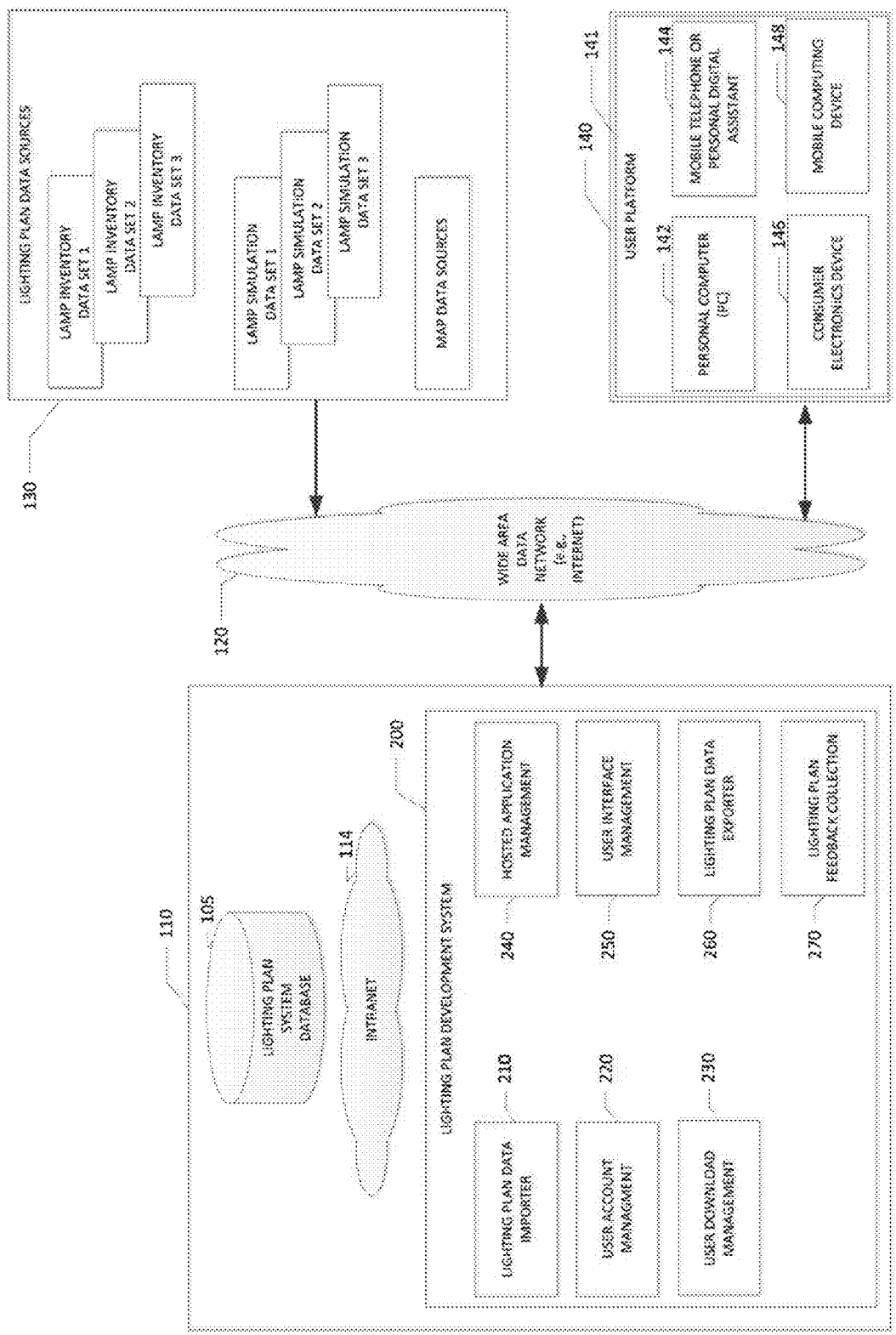
FIG. 1 illustrates an example embodiment of a system for enabling computer users to design and simulate a lighting plan or proposal.

Referring now to FIG. 1, in an example embodiment, a system for enabling users to design and simulate a lighting plan or proposal is disclosed. In various example embodiments, an application or service, typically provided by or operating on a host site (e.g., a website) 110, is provided to simplify and facilitate the downloading or hosted use of the lighting plan development system 200 of an example embodiment. In a particular embodiment, the lighting plan development system 200 can be downloaded from the host site 110 by a user at a user platform 140. Alternatively, the lighting plan development system 200 can be hosted by the host site 110 for a networked user at a user platform 140. The details of the lighting plan development system 200 for an example embodiment are provided below.

Referring again to FIG. 1, the lighting plan development system 200 can be in network communication with a plurality of lighting plan data sources 130. The lighting plan data sources 130 can include lamp simulation data sources, such as a lamp or lighting element manufacturer (or others) that creates lamp simulations and uploads the data corresponding to these lamp simulations (lamp simulation data set) to the host site 110. The lighting plan data sources 130 can also include sources of lamp inventory data sets, which include lamp specifications for particular brands or types of specific lamps or lighting elements. The lamp inventory data sets might be provided by a lamp manufacturer, distributor, or seller who uploads a spreadsheet of lamp inventory data to the host site 110. The spreadsheet of lamp inventory data can include a set of parameters associated with various attributes of each specific type of lamp. In a particular embodiment, uploading a spreadsheet of lamp inventory data can cause the lighting plan development system 200 on the host site 110 to automatically construct simulations for the uploaded lamp specifications based on all the information the lighting plan development system 200 has in its database 105. The data retained by database 105 is detailed below. If the lighting plan development system 200 is able to find a previously developed specially-made simulation created by, for example, the lamp manufacturer by matching the lamp product identifier (ID) in the inventory spreadsheet to a product ID uploaded along with the simulation by the manufacturer, then the manufacturer simulation can be associated with the particular lamp product and used by the lighting plan development system 200 to simulate the lamp product. If the lighting plan development system 200 cannot find any such matches of previously developed lamp simulations, the lighting plan development system 200 can automatically construct a lamp simulation based on the lamp specifications, which can include the name of the lamp, and perhaps a set of parameters associated with various attributes of the specific type of lamp. The lighting plan development system 200 can use this information to create a decent simulation for the particular type of lamp. In some cases, the automatically constructed simulations can be good enough to enable a user to design a lighting plan or proposal. Additionally, the user can modify a previously developed simulation or an automatically constructed simulation to improve the accuracy of the simulation. Once the user uploads modified simulations to host site 110, then the next time the user uploads a lamp inventory that contains that particular lamp, such as the user might do for another lighting plan that uses a different set of lamps that includes some but not all previously used lamps, then the lighting plan development system 200 can subsequently use the modified simulation and thereby provide better results for the lamp inventory upload as time goes on. The lighting plan data sources 130 can also include sources of maps or mapping data used for generated an initial map of a region of interest, a region in which lighting elements will be placed as part of the lighting plan or proposal. In one embodiment, Google Maps can be used as a source of mapping data. Given an address or geo-coordinates, the source of the mapping data can provide a graphical image or photographic image of the corresponding geographical location, which can be imported into and used by the lighting plan development system 200. In one embodiment, a client device 141 can include a global positioning system (GPS) receiver for automatically receiving geo-coordinates corresponding to a current location of the client device 141. These automatically received geo-coordinates can be used to obtain the mapping data in the manner described above.

One or more of the lighting plan data sources 130 can be provided by one or more third party providers operating at various locations in a network ecosystem. It will be apparent to those of ordinary skill in the art that lighting plan data sources 130 can be any of a variety of networked third party providers as described in more detail below. In a particular embodiment, a source list maintained at the host site 110 can be used as a summary or list of all lighting plan data sources 130, which users or the host site 110 may visit/access and from which users or the host site 110 can obtain lamp data. The host site 110, lighting plan data sources 130, and user platforms 140 may communicate and transfer data and information in the data network ecosystem shown in FIG. 1 via a wide area data network (e.g., the Internet) 120. Various components of the host site 110 can also communicate internally via a conventional intranet or local area network (LAN) 114.

Networks 120 and 114 are configured to couple one computing device with another computing device. Networks 120 and 114 may be enabled to employ any form of computer readable media for communicating information from one electronic device to another. Network 120 can include the Internet in addition to LAN 114, wide area networks (WANs), direct connections, such as through a universal serial bus (USB) port, other forms of computer-readable media, or any combination thereof. On an interconnected set of LANs, including those based on differing architectures and protocols, a router and/or gateway device acts as a link between LANs, enabling messages to be sent between computing devices. Also, communication links within LANs typically include twisted wire pair or coaxial cable, while communication links between networks may utilize analog telephone lines, full or fractional dedicated digital lines including T1, T2, T3, and T4, Integrated Services Digital Networks (ISDNs), Digital Subscriber Lines (DSLs), wireless links including satellite links, or other communication links known to those of ordinary skill in the art. Furthermore, remote computers and other related electronic devices can be remotely connected to either LANs or WANs via a wireless link, WiFi, Bluetooth, satellite, or modem and temporary telephone link.

Networks 120 and 114 may further include any of a variety of wireless sub-networks that may further overlay stand-alone ad-hoc networks, and the like, to provide an infrastructure-oriented connection. Such sub-networks may include mesh networks, Wireless LAN (WLAN) networks, cellular networks, and the like. Networks 120 and 114 may also include an autonomous system of terminals, gateways, routers, and the like connected by wireless radio links or wireless transceivers. These connectors may be configured to move freely and randomly and organize themselves arbitrarily, such that the topology of networks 120 and 114 may change rapidly and arbitrarily.

Networks 120 and 114 may further employ a plurality of access technologies including 2nd (2G), 2.5, 3rd (3G), 4th (4G) generation radio access for cellular systems, WLAN, Wireless Router (WR) mesh, and the like. Access technologies such as 2G, 3G, 4G, and future access networks may enable wide area coverage for mobile devices, such as one or more of client devices 141, with various degrees of mobility. For example, networks 120 and 114 may enable a radio connection through a radio network access such as Global System for Mobile communication (GSM), General Packet Radio Services (GPRS), Enhanced Data GSM Environment (EDGE), Wideband Code Division Multiple Access (WCDMA), CDMA2000, and the like. Networks 120 and 114 may also be constructed for use with various other wired and wireless communication protocols, including TCP/IP, UDP, SIP, SMS, RTP, WAP, CDMA, TDMA, EDGE, UMTS, GPRS, GSM, UWB, WiFi, WiMax, IEEE 802.11x, and the like. In essence, networks 120 and 114 may include virtually any wired and/or wireless communication mechanisms by which information may travel between one computing device and another computing device, network, and the like. In one embodiment, network 114 may represent a LAN that is configured behind a firewall (not shown), within a business data center, for example.

The lighting plan data sources 130 may include any of a variety of providers of network transportable digital data. The network transportable digital data can be transported in any of a family of file formats and associated mechanisms usable to enable a host site 110 and a user platform 140 to receive data from a lamp data source 130 over a network 120. In one embodiment, the file format can be a MICROSOFT Excel spreadsheet format or a CSV (Comma Separated Values) format; however, the various embodiments are not so limited, and other file formats and transport protocols may be used. For example, data formats other than Excel or CSV or formats other than open/standard formats can be supported by various embodiments. Any electronic file format, such as Microsoft Access Database Format (MDB), Portable Document Format (PDF), audio (e.g., Motion Picture Experts Group Audio Layer 3—MP3, and the like), video (e.g., MP4, and the like), and any proprietary interchange format defined by specific sites can be supported by the various embodiments described herein. Moreover, a lamp data source 130 may provide more than one lamp data set and/or more than one lamp simulation data set.

In a particular embodiment, a user platform 140 with one or more client devices 141 enables a user to access data and simulations from the lighting plan development system 200 via the host 110 and network 120. Client devices 141 may include virtually any computing device that is configured to send and receive information over a network, such as network 120. Such client devices 141 may include portable devices 144, such as, cellular telephones, smart phones, display pagers, radio frequency (RF) devices, infrared (IR) devices, global positioning devices (GPS), Personal Digital Assistants (PDAs), handheld computers, wearable computers, tablet computers, integrated devices combining one or more of the preceding devices, and the like. Client devices 141 may also include other computing devices, such as personal computers 142, multiprocessor systems, microprocessor-based or programmable consumer electronics, network PC's, and the like. Client devices 141 may also include other processing devices, such as consumer electronic (CE) devices 146 and/or mobile computing devices 148, which are known to those of ordinary skill in the art. As such, client devices 141 may range widely in terms of capabilities and features. For example, a client device configured as a cell phone may have a numeric keypad and a few lines of monochrome LCD display on which only text may be displayed. In another example, a web-enabled client device may have a touch sensitive screen, a stylus, and several lines of color LCD display in which both text and graphics may be displayed. Moreover, the web-enabled client device may include a browser application enabled to receive and to send wireless application protocol messages (WAP), and/or wired application messages, and the like. In one embodiment, the browser application is enabled to employ HyperText Markup Language (HTML), Dynamic HTML, Handheld Device Markup Language (HDML), Wireless Markup Language (WML), WMLScript, JavaScript, EXtensible HTML (xHTML), Compact HTML (CHTML), and the like, to display and/or send digital information. In other embodiments, mobile devices can be configured with applications (apps) with which the functionality described herein can be implemented.

Client devices 141 may also include at least one client application that is configured to receive mapping or lamp data or/or control data from another computing device via a wired or wireless network transmission. The client application may include a capability to provide and receive textual data, graphical data, video data, audio data, and the like. Moreover, client devices 141 may be further configured to communicate and/or receive a message, such as through a Short Message Service (SMS), direct messaging (e.g., Twitter), email, Multimedia Message Service (MMS), instant messaging (IM), internet relay chat (IRC), mIRC, Jabber, Enhanced Messaging Service (EMS), text messaging, Smart Messaging, Over the Air (OTA) messaging, or the like, between another computing device, and the like.

Figure 2:
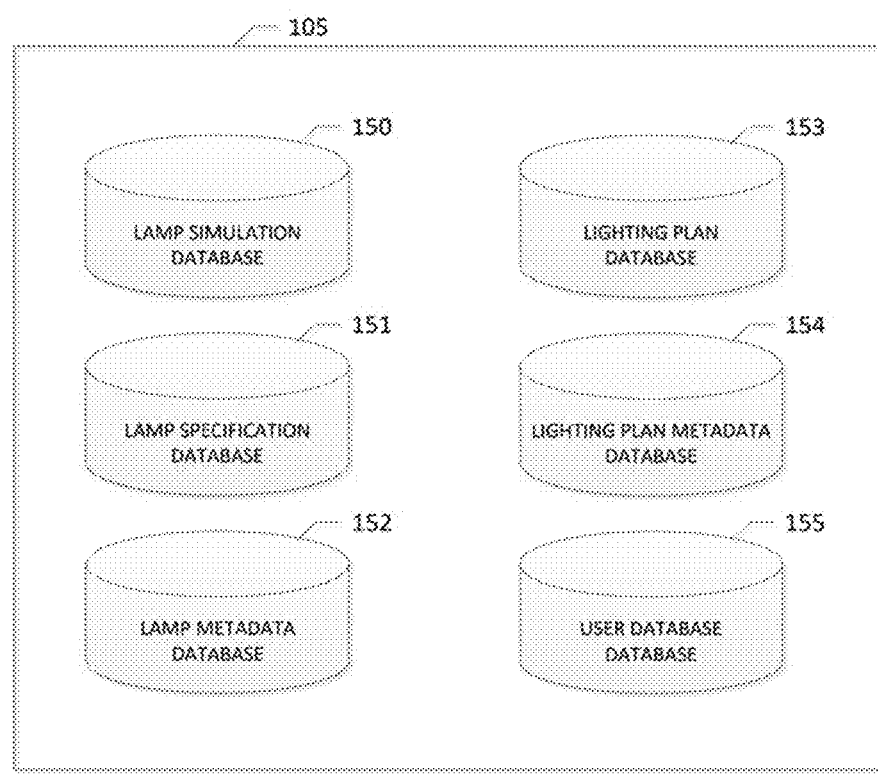
FIG. 2 illustrates a detail of the databases used in an example embodiment.

Referring again to FIG. 1, the lighting plan development system 200 for an example embodiment is shown to include a lighting plan system database 105. Referring now to FIG. 2, the components of database 105 are illustrated for an example embodiment. Each of these database 105 components is described in detail below.

Lamp Simulation Database 150—A user can save a simulation of an individual lamp to the host site 110, so other users can browse and download the saved lamp simulation. These lamp simulations, which are collections of simulation parameters and simulation programs, can be automatically created by the lighting plan development system 200 from lamp specification data, or they can be created by the user by editing simulation parameters through a graphical user interface. For example, the simulation parameters might include the color of the light emitted by the lamp, the illumination pattern, the light intensity profile over the illuminated area, the effects of weather conditions, and the like. The lamp simulations can be stored in Lamp Simulation Database 150. Additionally, some lamp manufacturers may have already spent time creating simulations of their lamp inventory. These already-created lamp simulations can be uploaded to the lighting plan development system 200 from the lighting plan data sources 130. These uploaded simulations and the simulations automatically created by the lighting plan development system 200 can be stored in Lamp Simulation Database 150.

Lamp Specification Database 151—Entering lamp specification data one by one for all of an inventory of thousands of lamp varieties can be tedious work for users. Many users prefer to upload a spreadsheet of lamp specification data for their inventory of lamps, and to have the lighting plan development system 200 automatically create plans and simulations according to the lamp specification data in the database 151. When a user uploads a lamp inventory spreadsheet to host site 110, the lighting plan development system 200 can store the lamp inventory data into database 151. The lighting plan development system 200 can then use the uploaded lamp inventory data to automatically construct a related lighting plan or lamp simulation. The data for the constructed simulation can be stored in the database 150. If a user doesn't like the constructed simulation, the user can modify the simulation and upload the modified simulation to the lighting plan development system 200. The uploaded modified simulation is stored in the database 150. The lighting plan development system 200 can then use this uploaded modified simulation to do a better job of constructing a simulation for a lamp with the same lamp specification in the future, for this user, who might upload a lamp inventory spreadsheet again for another lighting plan, or an entirely different user.

Lamp Metadata Database 152—This database can be used for storage of reviews, comments, digital rights information, etc., for the lamp simulations stored in database 150.

Lighting Plan Database 153—This database can be used for storage of lighting plan data and portions of lighting plans that users have created and saved to the host site 110, which other users can access, subject to access privileges. In a particular embodiment, users in a workgroup are able to share lighting plans over the network privately within the workgroup, for example.

Lighting Plan Metadata Database 154—This database can be used for storage of reviews, comments, digital rights information, etc., for the lighting plans stored in database 153.

User Database 155—This database can be used for storage of user account information, user profiles, user privileges, etc.

Referring again to FIG. 1, host site 110 of an example embodiment is shown to include a lighting plan development system 200. Lighting plan development system 200 includes lighting plan data importer 210, user account management module 220, user download management module 230, hosted application management module 240, user interface management module 250, lighting plan data exporter module 260, and lamp feedback collection module 270. Each of these modules can be implemented as software components executing within an executable environment of lighting plan development system 200 operating on host site 110 or user platform 140. Each of these modules of an example embodiment is described in more detail below in connection with the figures provided herein.

Referring to FIG. 1, the lighting plan development system 200 can include a lighting plan data importer 210. The lighting plan data importer 210 receives uploaded lamp inventory specification data sets and lamp simulation data sets from the data sources 130 and stores the received data in the appropriate portion of database 105, such as Lamp Simulation Database 150 and Lamp Specification Database 151. The lighting plan data importer 210 also receives mapping data from map data sources 130.

Figure 3:
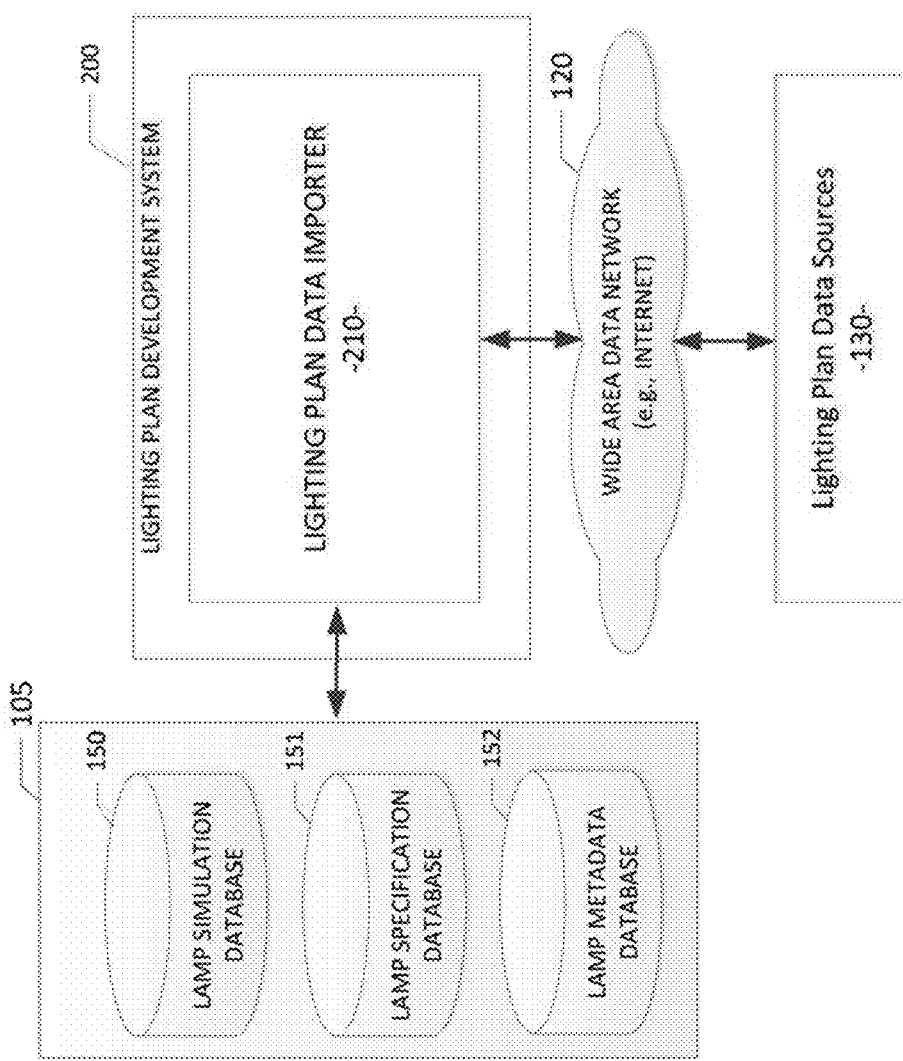
FIG. 3 illustrates a detail of the lighting plan data importer of an example embodiment.

Referring now to FIG. 3, a detail of the lighting plan data importer 210 in an example embodiment is illustrated. As shown, lighting plan data importer 210 is in data communication via network 120 with a plurality of lighting plan data sources 130, one or more of database 105, and the other processing modules of the lighting plan development system 200 (not shown in FIG. 3). In general, the lighting plan data importer 210 is responsible for collecting and processing lamp or lighting element data items (e.g., lamp simulations and lamp inventory specifications) received from a variety of lighting plan data sources 130. In a particular embodiment, these lighting plan data sources 130 can include individual or aggregated data sources as described above. Aggregated data sources can represent any of a variety of conventional sites or services that pull or receive lamp data items from various sources and collect the lamp data items in a local collector (e.g., a lamp distributor or reseller). The local collector of a lamp data source 130 may then provide these lamp data items to host site 110 via the wide area data network 120.

Lighting plan data importer 210 can be configured to interface with any of the lighting plan data sources 130 via wide area data network 120. Because of the variety of lighting plan data sources 130 providing data to lighting plan data importer 210, the lighting plan data importer 210 needs to manage the interface to the various lighting plan data sources 130. This data source interlace or data management process performed by lighting plan data importer 210 can include retaining meta information on each data item, document, or object received from a lamp data source 130. This retained meta information can include an identifier or address of the corresponding data item, document, or object received from a lamp data source 130, an identifier or address of the corresponding lamp data source 130, the timing or versioning associated with the data item, document, or object, including the time when the latest update of an item was received, and the like. This meta information related to the data items, documents, or objects received from lighting plan data sources 130 can be stored in database 152.

The lighting plan data importer 210 also receives mapping data from map data sources 130. The mapping data can be used for generating an initial map of a region of interest, a region in which lighting elements will be placed as part of the lighting plan or proposal. In one embodiment, Google Maps can be used as a source of mapping data. Given an address or geo-coordinates, the source of the mapping data can provide a graphical image or photographic image of the corresponding geographical location, which can be imported into and used by the lighting plan development system 200.

The data management process performed by lighting plan data importer 210 can also include performing any transcoding, decompression, decryption, formatting, and/or the like that may be necessary to process and/or simulate a particular data item received from a lamp data source 130 via host site 110. The data management process performed by lighting plan data importer 210 can also include the fetching, staging, and processing of particular lamp data items as users of lighting plan data sources 130 use the lighting plan data importer 210 as described herein.

Referring again to FIG. 1, the lighting plan development system 200 also includes user account management module 220, user download management module 230, hosted application management module 240, user interface management module 250, lighting plan data exporter module 260, and lamp feedback collection module 270. Each of these modules is described in more detail next. The user account management module 220 provides the functionality and interfaces for a user to register with the host site 110 and create, modify, and manage a user account and related user information data sets. As part of the creation of a user information data set, a user can assign a unique identifier (also denoted a user identifier or user ID) to the user information data set. Alternatively, the user account management module 220 can automatically create and assign the user ID to the user information data set. In one embodiment, the user ID can be a unique eight digit number. In an alternative embodiment, the user ID can be an alphanumeric string of arbitrary length, which can be used to uniquely identify a particular user information data set and corresponding user. The user information data sets can be stored in user database 155.

Once the user ID is created using any of the embodiments described above, the user ID can be used by a user to access and configure user-specific information in a user information data set retained on host site 110 in a conventional manner. In a particular embodiment, a user profile can be created and maintained in user database 155. Additionally, other user data for particular users can be maintained by user account management module 220. This other user data can include a user history, a user rating, and the like. It will be apparent to those of ordinary skill in the art that other user information may similarly be configured and retained in user data 155 by the user account management module 220. Thus, for various embodiments, a user can register with the host site 110 and use host site 110, and the user account management module 220 therein, to create and maintain a user information data set and a corresponding unique user ID.

Referring again to FIG. 1, the lighting plan development system 200 of an example embodiment is shown to include a user download management module 230 and a hosted application management module 240. As one option, the lighting plan development system 200, or a portion thereof, can be downloaded to a user device 141 of user platform 140 and executed locally on a user device 141. The downloading of the lighting plan development system 200 application can be accomplished using conventional software downloading functionality. As a second option, the lighting plan development system 200 can be hosted by the host site 110 and executed remotely, from the user's perspective, on host system 110. In one embodiment, the lighting plan development system 200 can be implemented as a service in a service oriented architecture (SOA). In any case, the functionality performed by the lighting plan development system 200 is as described herein, whether the application is executed locally or remotely, relative to the user.

Referring again to FIG. 1, the lighting plan development system 200 of an example embodiment is shown to include a user interface management module 250. The user interface management module 250 handles the presentation of various user interface displays, display screens, windows, frames, or the like. In an alternative embodiment, the user interface can be implemented as a series of web pages. In another alternative embodiment, the user interface can be implemented as a series display screens on a mobile device as implemented by a mobile application or app. In yet another alternative embodiment, the user interface can be implemented as a series of voice command/responses implemented using conventional voice recognition and voice synthesis technology on a mobile device as implemented by a mobile application or app. These various user interface displays are provided to present information and lighting plan images to a user of the lighting plan development system 200 of an example embodiment. The user interface management module 250 also receives user inputs and configures the various user interface displays in conformity with the user inputs, command selections, and the like.

Although the various user interface displays provided by the user interface management module 250 are nearly infinitely varied, several sample user interface sequences are provided herein and in the corresponding figures to describe various features of the disclosed embodiments. These sample user interface displays and sequences are described below.

In one embodiment, a lighting plan or proposal data exporter module 260 and a lighting plan feedback collection module 270 are provided. The lighting plan or proposal data exporter module 260 handles the exporting of lighting plans or proposals data to external systems, including networked systems. The lighting plan or proposal data exporter module 260 can also control the export of scripts, spreadsheets, and other data sets created or modified by the lighting plan development system 200 of an example embodiment.

The lighting plan feedback collection module 270 can collect information from $3^{rd}$ party users, the collected information including rating information, comments, customer feedback, and the like that indicate the extent to which particular viewers liked or disliked a particular lighting plan or proposal. The collected feedback can be correlated to the particular lighting plan or proposal to which the feedback relates.

Figure 4:
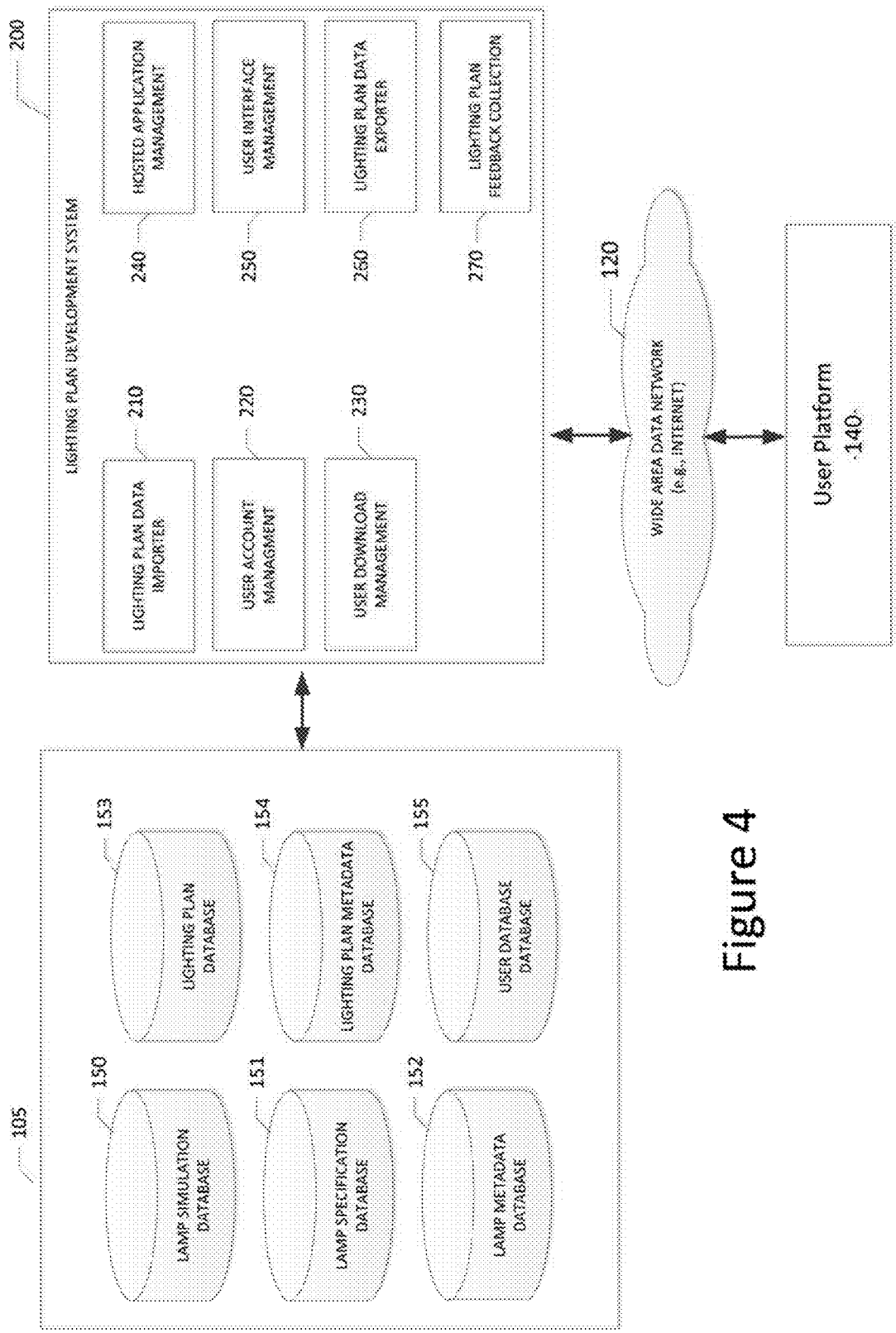
FIG. 4 illustrates a detail of a hosted lighting plan or proposal development system of an example embodiment from a user perspective.

Referring now to FIG. 4, a detail of the lighting plan development system 200 of an example embodiment from a user perspective is illustrated. As described above, the lighting plan development system 200 can be downloaded to a user device 141 of user platform 140 or executed on host system 110. The lighting plan development system 200 may communicate and transfer data and information in the network ecosystem via a wide area data network (e.g., the Internet) 120. In this manner, the lighting plan development system 200 may communicate and transfer data and information with a user of a user device 141 of user platform 140. In general, the user can interact with the lighting plan development system 200 via a graphical user interface (GUI) implemented in an example embodiment as a set of webpages or application display screens described in more detail below.

Figure 5:
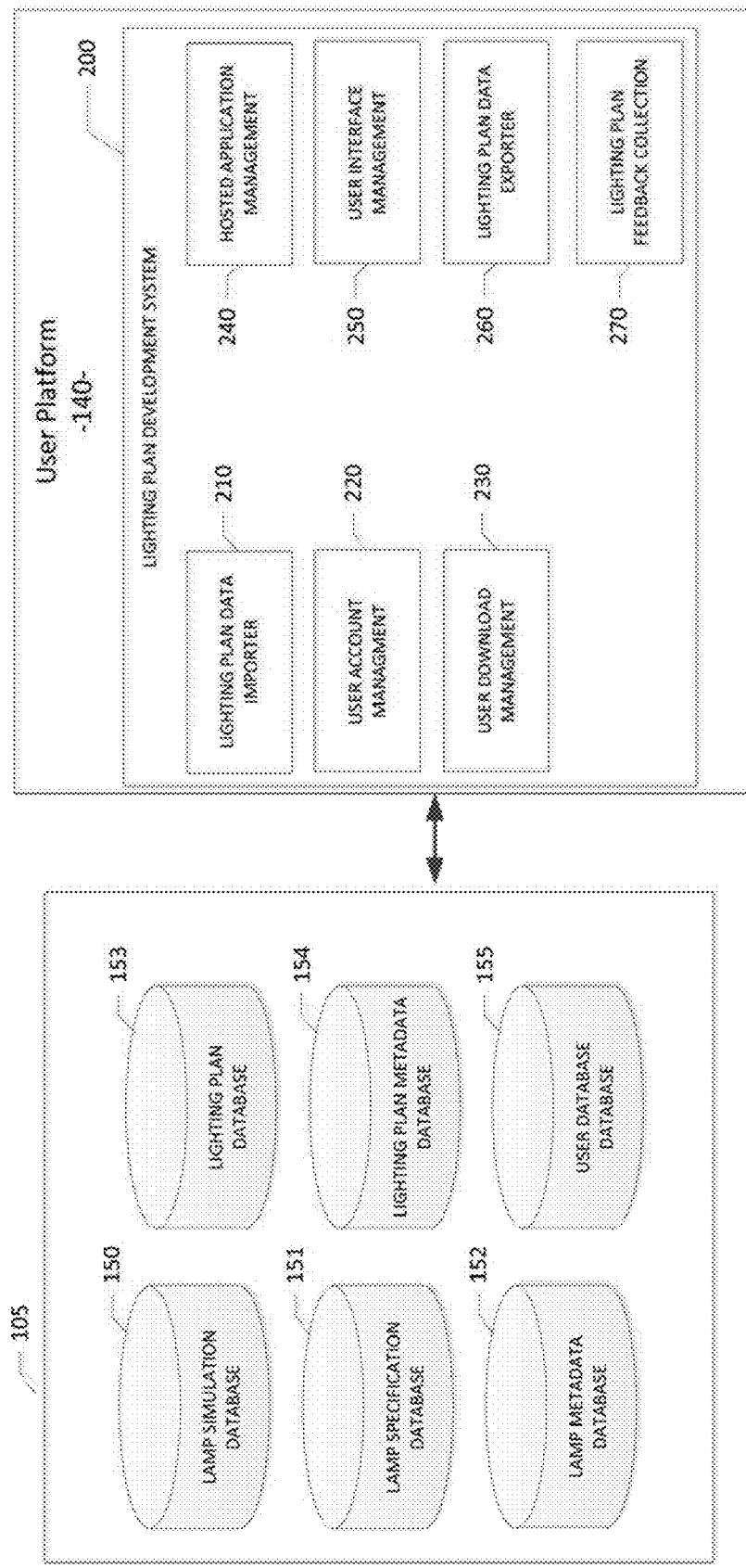
FIG. 5 illustrates a detail of a stand-alone, client-resident lighting plan or proposal development system of an example embodiment from a user perspective.

In one embodiment, the lighting plan development system 200 can run over a network. However, other embodiments can run the lighting plan development system 200 as a stand-alone, client-resident program. FIGS. 1, 3-4, and 19 illustrate a networked implementation of the lighting plan development system 200 of various embodiments. FIG. 5 illustrates a stand-alone, client-resident program implementation of the lighting plan development system 200 of a particular embodiment. For the networked implementation of the lighting plan development system 200, network connectivity may be required for the on-line features of various embodiments. However, the development and operation of a lighting plan or proposal on a stand-alone system can also be beneficial where network connectivity may not be available or convenient.

Referring now to FIG. 5, a stand-alone, client-resident program implementation of the lighting plan development system 200 of a particular embodiment is illustrated. In this embodiment, the lighting plan development system 200 can be downloaded to or installed on a user platform 140. The functionality of the lighting plan development system 200 as described herein can be executed directly on the client machine of the user platform 140. The database 105 can also be locally accessible to the user platform 140 and the lighting plan development system 200 executing thereon. In other respects, the hosted version or user platform installed version of the lighting plan development system 200 can operate in the manner described herein.

Figure 6:
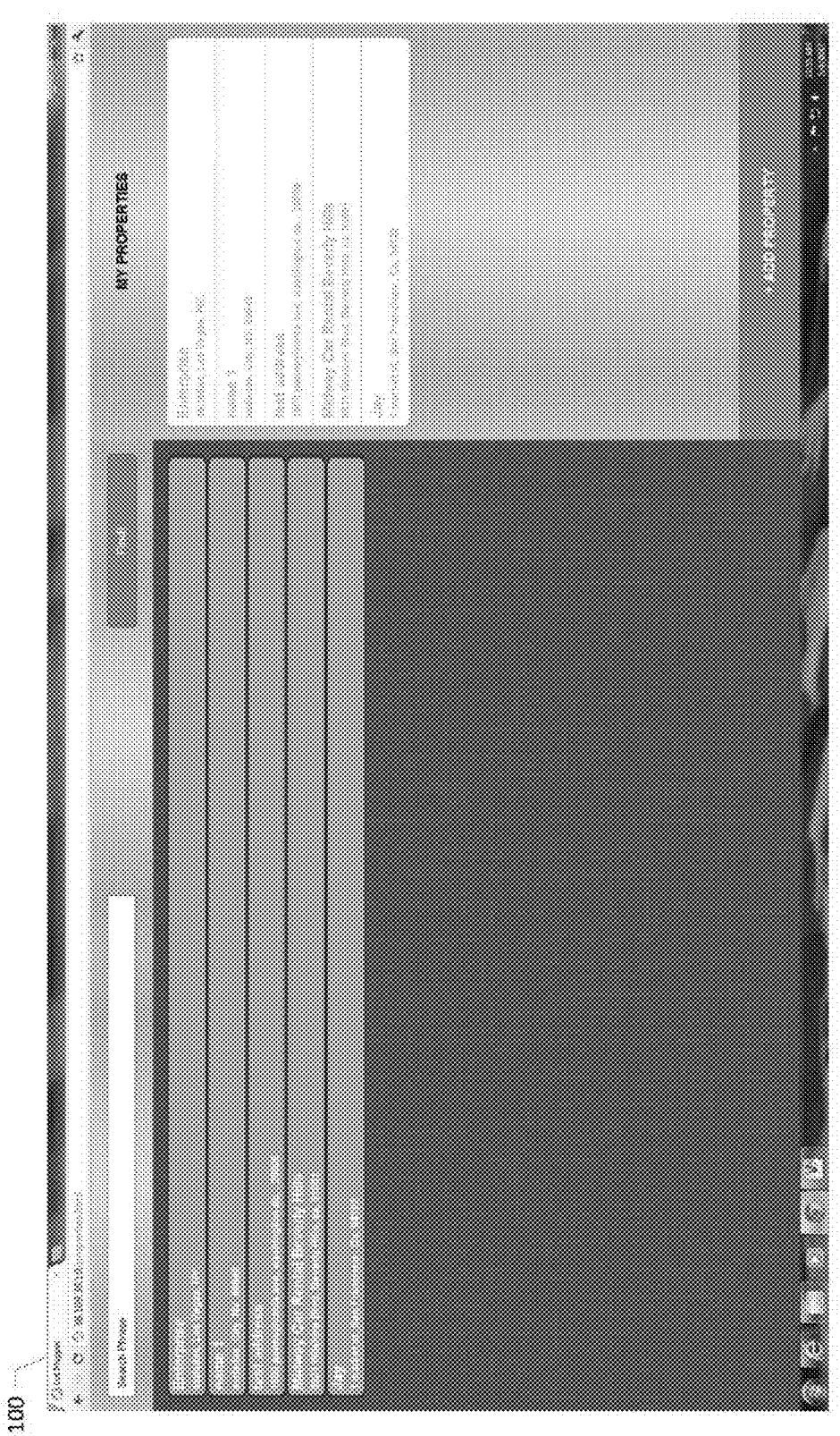
FIGS. 6 through 16 illustrate example user interface screen snapshots of example embodiments.
Figure 7:
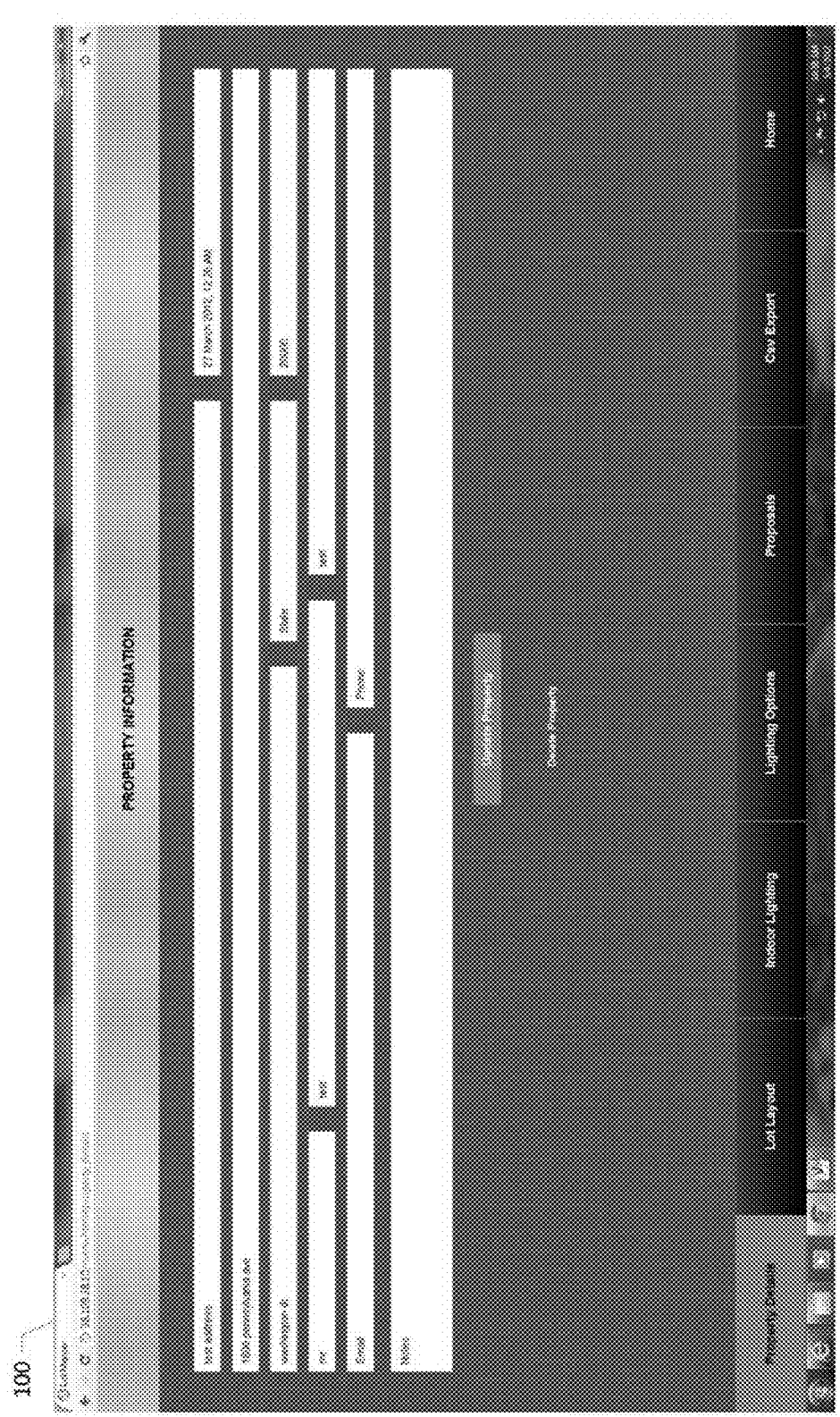

Referring now to FIGS. 6-16, several sample user interface screen snapshots and sequences are illustrated. These sample user interface sequences illustrate various features, structures, and operations of various example embodiments. Referring to FIG. 6, for each these sample user interface sequences, a user interface screen 100, window, or display image is presented on a user/client device 141. The user interface 100 typically includes a set of information and command options for selection by a user. Each of these user interface screens 100 shown in FIGS. 6-16 are described next as part of the generation of a sample lighting plan and proposal by the lighting plan development system 200 of an example embodiment.

Referring now to FIG. 6, the sample user interface screen 100 illustrates the result after a user has launched the lighting plan development system 200 of an example embodiment. As shown, the user is initially presented with a list of previously-generated lighting plans or mapped regions. In the particular sample embodiment, the list elements are denoted as 'Properties'. Each list element (e.g., property) represents a geographic location that has been previously mapped. As such, for each list element, the lighting plan data importer 210 has previously imported map data from a map source 130 and created a map corresponding to the particular list element location. Any of these previously mapped locations can be selected by the user by use of a conventional pointing device, gesture, keyboard key entry, voice command, or other method of indicating a selection to an electronic device. Alternatively, the user can choose to create a new location map by selecting or activating the '+ Add Property' button as shown in FIG. 6. As a result of selecting the '+ Add Property' button, the user is prompted to enter an address or geographic location, which is used to fetch and import corresponding map data from a map source 130 and create a map corresponding to the particular entered location. The user interface screen shown in FIG. 7 can be used to create a data set corresponding to a new property or to edit a data set corresponding to an existing property. Once the user has selected an existing or newly-created property, the user interface screen, such as the one shown in FIG. 8, is displayed.

Figure 8:
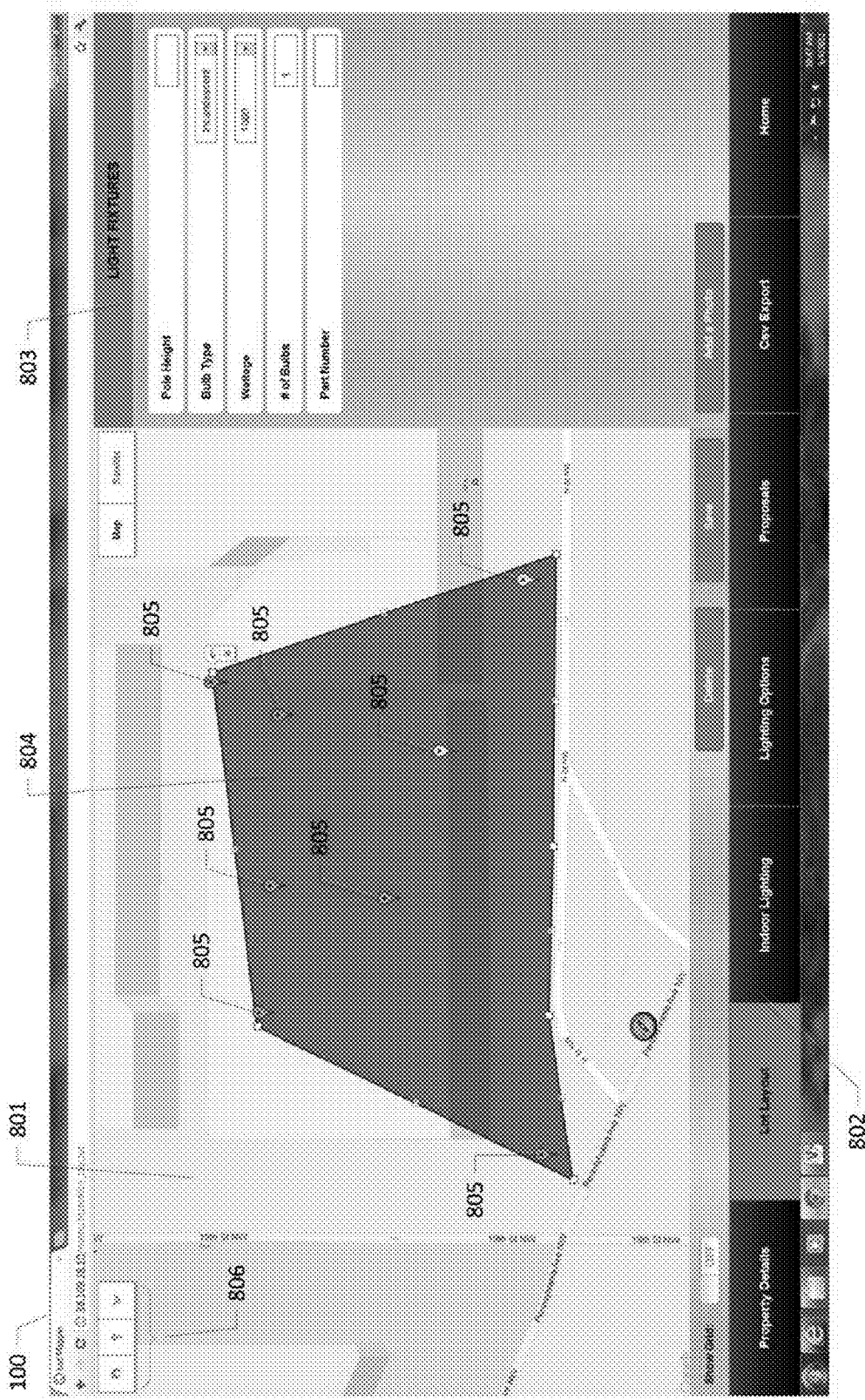

Referring now to FIG. 8, the user has selected an existing or newly-created property and the map 801 corresponding to the selected property is displayed in the sample user interface screen 100. In the sample user interface screen shown in FIG. 8, the map 801, corresponding to a selected property, is displayed in an upper-left portion of the user interface screen 100. A lower portion (denoted a command bar 802) of the screen is used to display a set of command options for navigating through the lighting plan development system 200. An upper-right portion (denoted a light fixture information block 803) of the screen is used to display a set of specifications associated with a selected lamp or lighting element.

Figure 9:

FIG. 9 illustrates an example in which a user has selected a particular lighting element 810. The selection of lighting element 810 can be performed using any of the conventional selection techniques described above or using a conventional mouseover or cursor hover operation. Once lighting element 810 is selected or identified, the specifications for the selected lighting element are displayed in the light fixture information block 803 and in a text block proximate to the selected lighting element. The presentation of this lighting element specification information for a particular example is shown in FIG. 9. It will be apparent to those of ordinary skill in the art that a similar procedure can be used by a user to view the specifications for any lighting element placed on map 801.

Referring again to FIGS. 8 and 9, the sample user interface screen 100 shown in FIGS. 8 and 9 also illustrates an overlay region 804 that has been drawn on the map 801 by the user by use of the drawing tool set 806. The overlay region 804 allows a user to specify a particular area in a mapped location that represents an area or region of interest. The region of interest corresponds to the area in which the user wishes to place lighting elements as part of a lighting plan. As described below, the placement of lighting elements on the map 801 is performed using a drag and drop operation provided by the various embodiments described herein. The drag and drop operation for an example embodiment is shown in FIG. 10.

Figure 10:
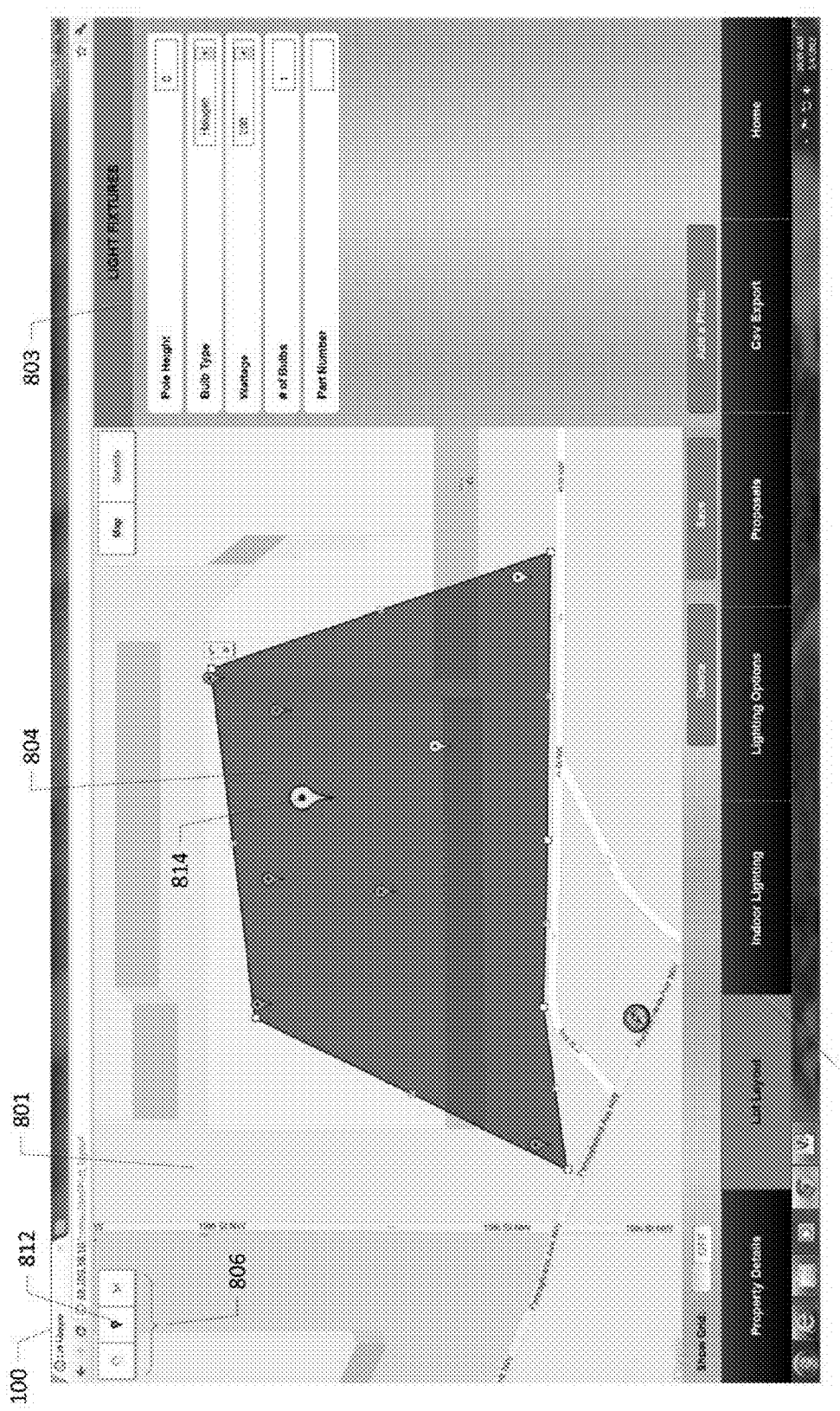
Figure 11:
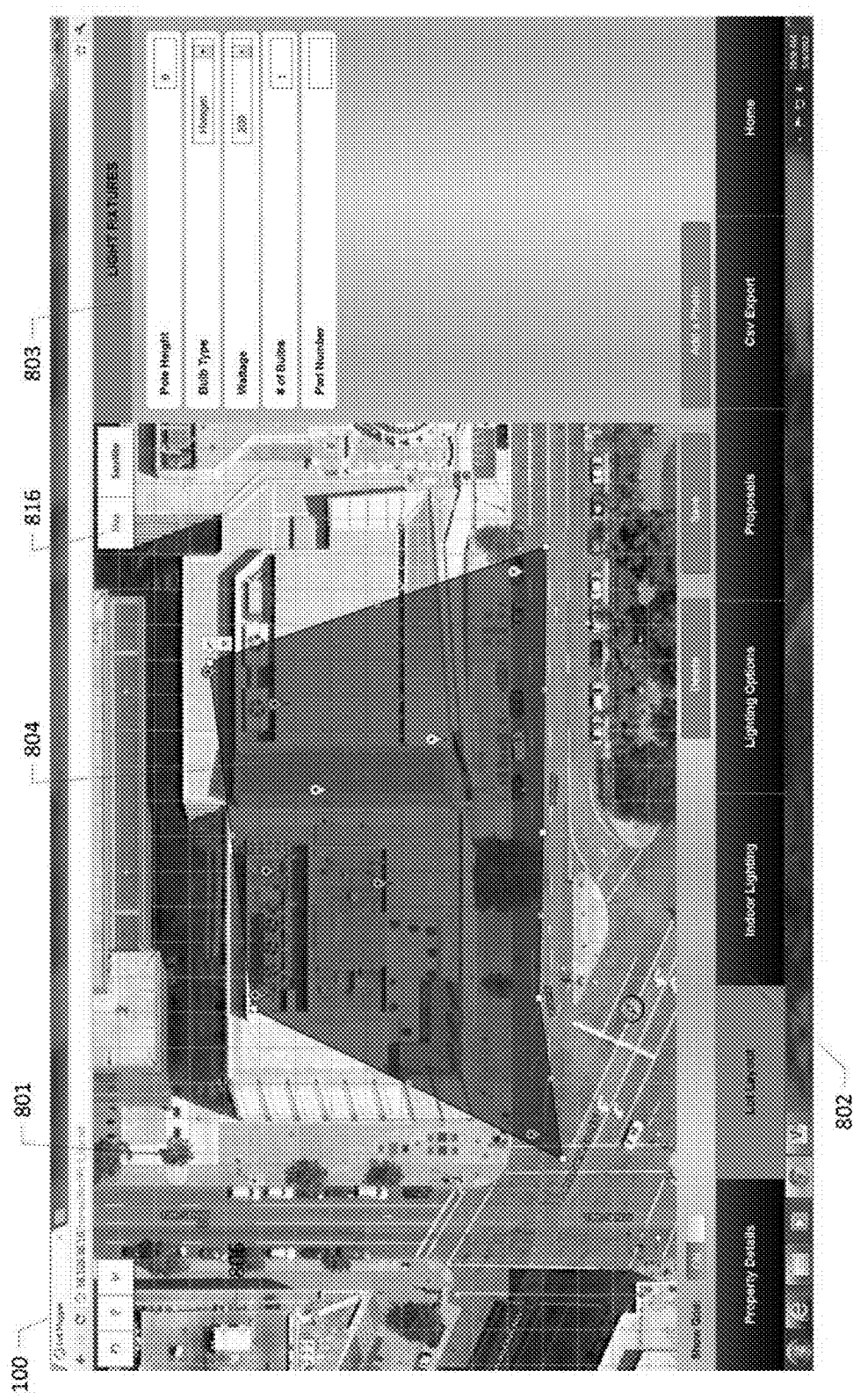

Referring now to FIG. 10, the drag and drop operation for the placement of lighting elements on the map 801 in an example embodiment is shown. In FIG. 10, the drawing tool set 806 includes a button 812 for adding a lighting element to the map 801. The user can activate the button 812 by using any of the conventional selection techniques described above. Once the button 812 for adding a lighting element activated, the user can move the cursor anywhere on the map 801. When the user positions the cursor in the desired location on the map 801, the user can drop a lighting element at that location by use of any of the conventional selection techniques described above. For example, the user can position the cursor in the desired location on the map 801 and activate a mouse button to drop a lighting element at that location. A result of this operation is shown in FIG. 10. As shown, a new lighting element 814 has been dropped on map 801 at a desired location. Similarly, additional lighting elements can be dropped at a plurality of desired locations on map 801. In this manner, a user can populate a particular region of interest with an array of lighting elements at desired locations appropriate for the location. Using the map 801 positioned underneath overlay region 804, the user can accurately position each lighting element at the appropriate location. As shown in FIG. 11, an embodiment also provides an option for replacing the map 801 with a photograph of the selected location. In this way, the user can see the exact location of each lighting element relative to the photographic image of the location. In one embodiment, Google Maps can be used to obtain the photographic image of the selected location. A map button 816 can be used to select the photographic image option. Using either the map option or the photographic image option, the user can accurately position each lighting element at the appropriate location. In one embodiment, a client device 141 can include a global positioning system (GPS) receiver for automatically receiving geo-coordinates corresponding to a current location of the client device 141. These automatically receiving geo-coordinates can be used to associate a geographical position with a particular lighting element. For example, a user can walk to a particular location in the region of interest with a GPS-equipped client device 141 in hand. The particular location can be a location of a current lighting element or a position where the user wants to position a new lighting element. Upon arriving at the desired location, the user can activate a GPS button provided by the user interface. As a result of activation of the GPS button, the lighting plan development system 200 can automatically fetch the geo-coordinates at the desired location using the GPS receiver of the client device 141 and associate the geo-coordinates with an existing lighting element or a new lighting element. In yet another embodiment, the user can manually enter a set of geo-coordinates to associate the manually-entered geo-coordinates with an existing lighting element or a new lighting element.

Figure 12:
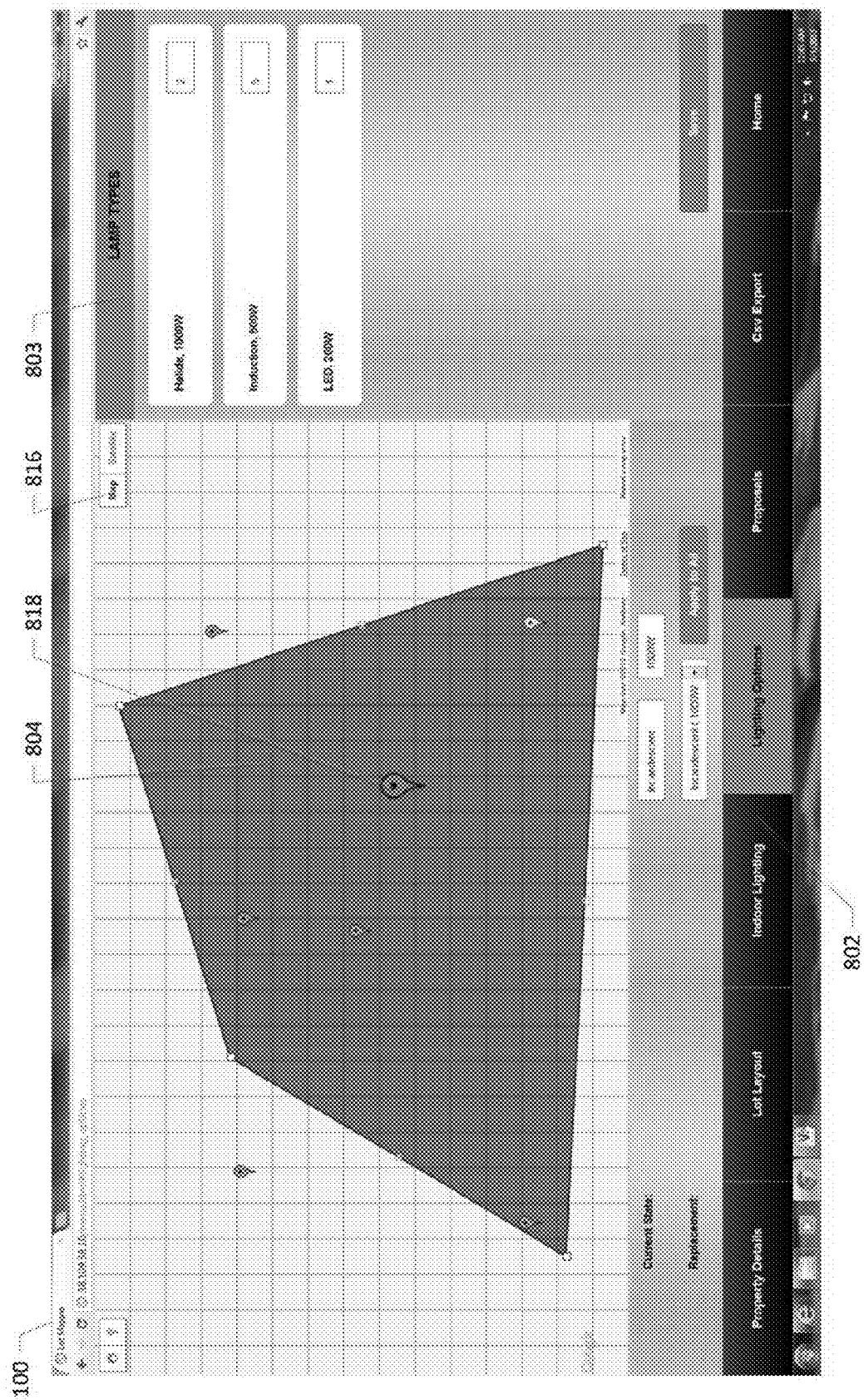
Figure 13:
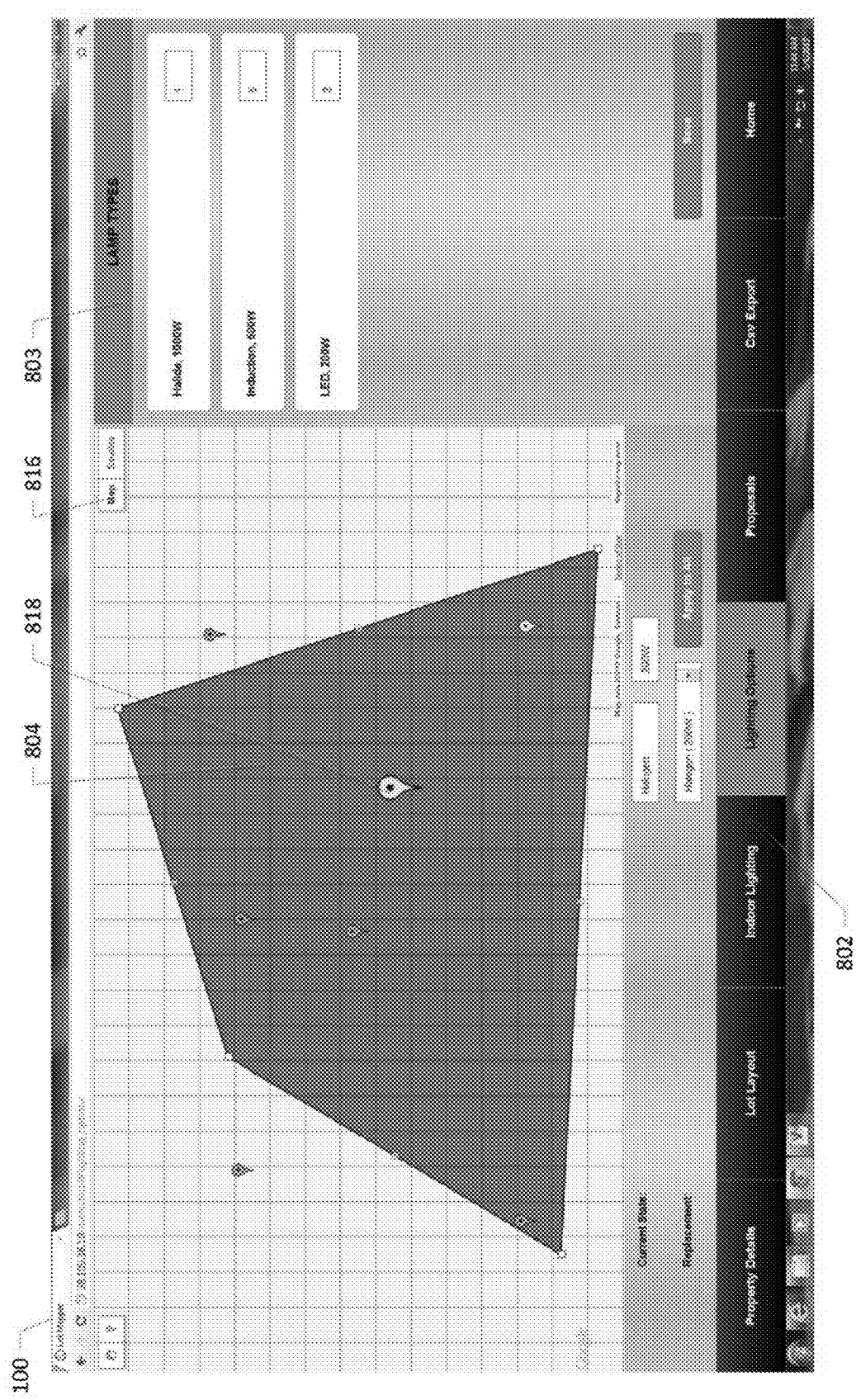

Additionally, the user can also specify the particular type of lighting element to be placed at each specified position on the map 801. As described above, the user can select any of the lighting elements on the map 801 by use of any of the conventional selection techniques described above. Once selected, the specifications of the selected lighting element can be viewed and/or modified by the user via the light fixture information block 803. An example of this functionality is shown in FIGS. 12 and 13 relative to lighting element 818. Using the light fixture information block 803, the user can specify the type of lighting element, the wattage, the height, the bulb type, the number bulbs, and the part number of the desired lighting element. In this manner, the user can specify the characteristics/specifications of each lighting element in a particular lighting plan. In another embodiment, a user can select a particular lamp type from a graphical inventory of individual drag/drop lamp types displayed in user interface 100. The graphical inventory of individual drag/drop lamp types can be displayed as separate graphical icons for each selectable type of lighting element. A graphical icon corresponding to a desired lamp type can be dragged to a location on the map 801 using the mouse or cursor control device. In a particular embodiment, the location to which the graphical icon of the selected lamp type is dragged represents the physical location where a lamp would be installed at the actual geographical location corresponding to the region of interest. In this manner, a user can manipulate a pointing device (e.g., a computer mouse) to visually drag a lamp icon from a graphical inventory to the map 801. FIGS. 8-11 represent a resulting sample user interface screen after a user has selected particular lamp types from the inventory of individual drag/drop lamp types and dragged an icon of the selected lamp type to a location on map 801.

Once a user employs the graphical drag and drop operation to add one or more selected lamps onto the map 801 as described above, an embodiment can save the lighting element locations and specifications in a lighting plan. The processing of the lighting plan can include correlating the location of a lighting element on map 801 to a physical location at the region of interest. In this manner, the lighting plan can define the proposed geographical locations of each of the lighting elements and the specifications for each of the lighting elements as defined by a user of the lighting plan development system 200.

Figure 14:
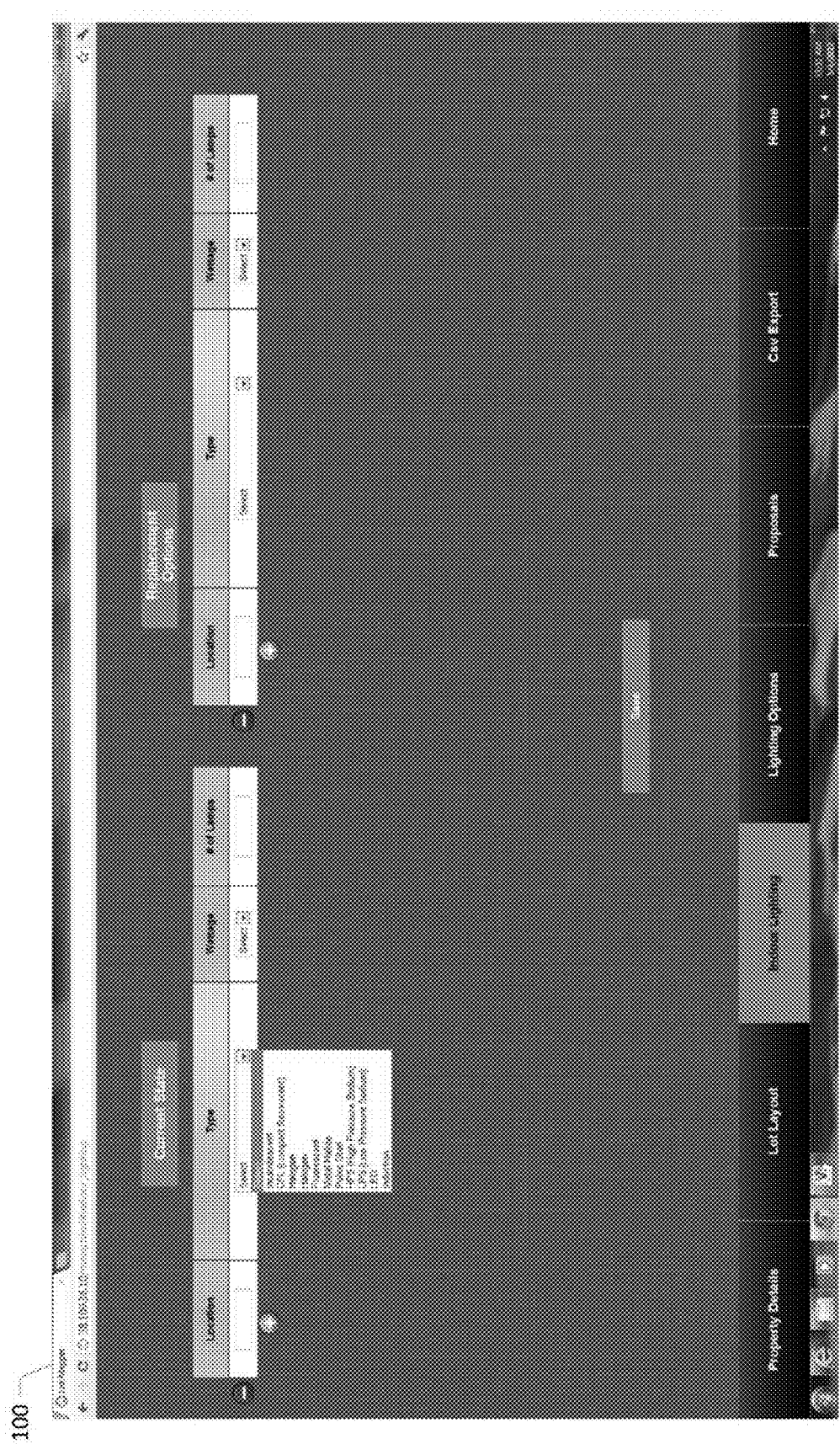
Figure 15:
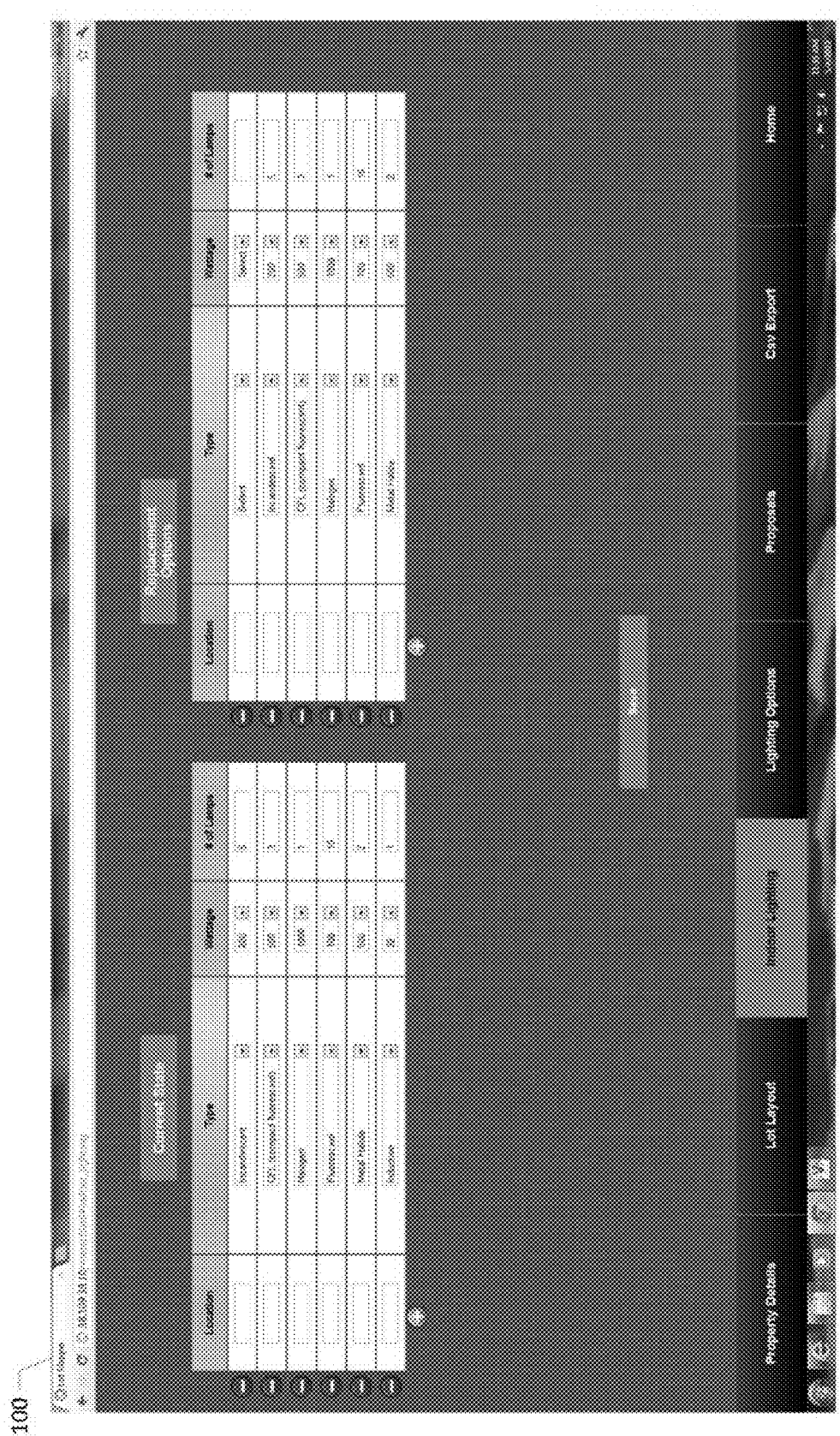

Referring to FIGS. 14-15, a user can view and/or modify a set of currently-specified lamp types that are included in a current lighting plan. In these sample user interface screens, the user can view and/or modify a current set of lamp types and a suggested set of replacement lamp types. In this manner, the user retains specific control over each attribute of each lighting element included in a particular lighting plan.

Figure 16:
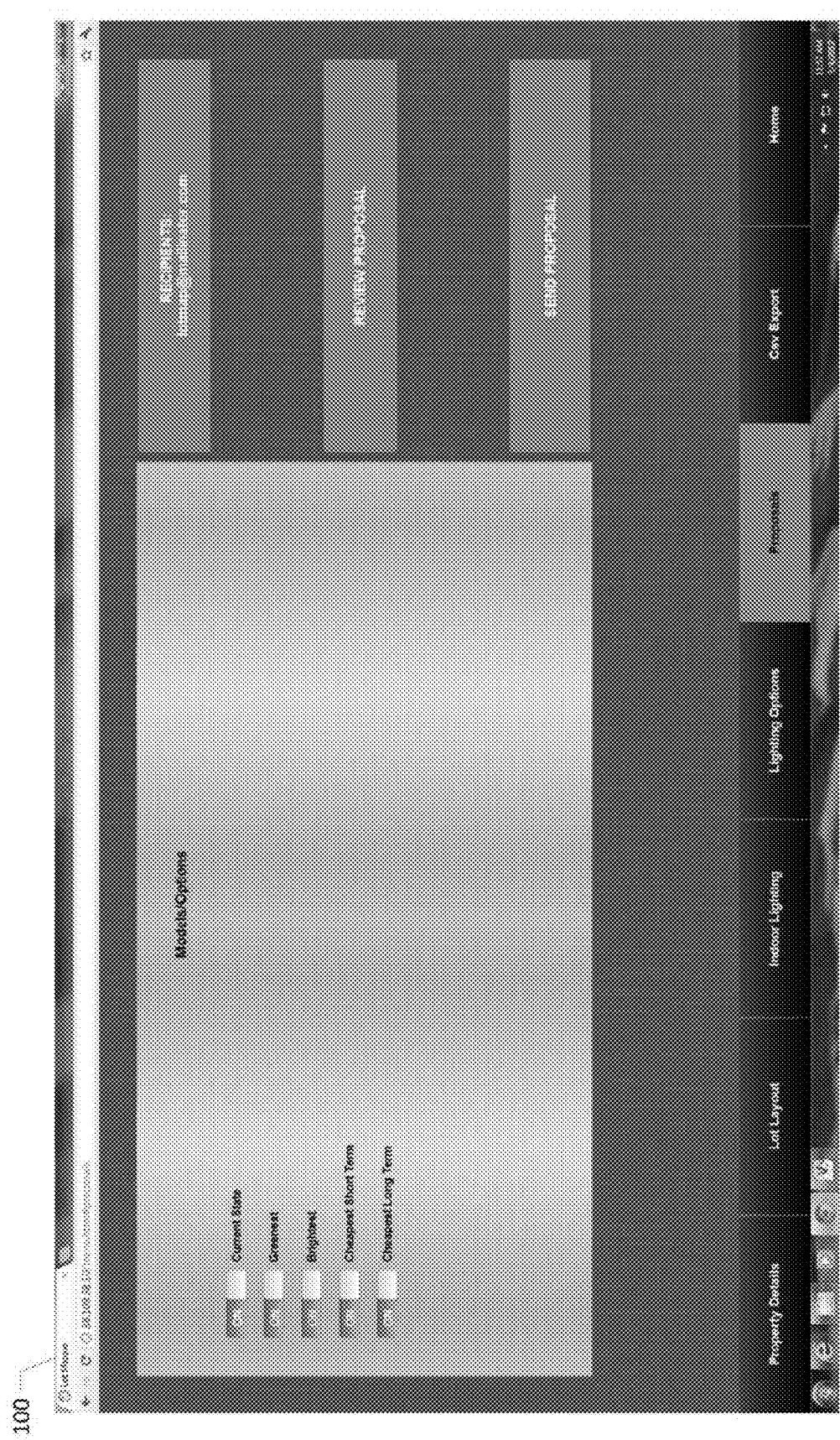

Referring to FIG. 16, the lighting plan development system of an example embodiment can generate a lighting plan that conforms to one of several user-selectable modes, including: current, greenest, brightest, cheapest short term, and cheapest long term. The 'Current' mode signals to the lighting plan development system that the user is interested in generating a lighting plan that simply uses the lighting element positions and lighting element types as specified by the user in the manner described above. The 'Greenest' mode signals to the lighting plan development system that the user is interested in generating a lighting plan that uses the lighting element positions as specified by the user in the manner described above. However, this mode also enables the lighting plan development system to automatically substitute the lighting element types specified by the user with lighting elements that will produce the 'greenest' lighting plan (e.g., a plan that produces the minimal carbon or waste footprint). The 'Brightest' mode signals to the lighting plan development system that the user is interested in generating a lighting plan that uses the lighting element positions as specified by the user in the manner described above. However, this mode also enables the lighting plan development system to automatically substitute the lighting element types specified by the user with lighting elements that will produce the 'brightest' lighting plan (e.g., a plan that produces the most light in the region of interest). The 'Cheapest Short Term' mode signals to the lighting plan development system that the user is interested in generating a lighting plan that uses the lighting element positions as specified by the user in the manner described above. However, this mode also enables the lighting plan development system to automatically substitute the lighting element types specified by the user with lighting elements that will produce the 'cheapest short term' lighting plan (e.g., a plan that uses the least expensive lighting elements without regard for the long term cost effects). The 'Cheapest Long Term' mode signals to the lighting plan development system that the user is interested in generating a lighting plan that uses the lighting element positions as specified by the user in the manner described above. However, this mode also enables the lighting plan development system to automatically substitute the lighting element types specified by the user with lighting elements that will produce the 'cheapest long term' lighting plan (e.g., a plan that uses minimally expensive lighting elements with consideration of the long term cost effects). It will be apparent to those of ordinary skill in the art that the lighting plan development system of a particular embodiment can include other modes for specifically configuring a particular lighting plan. In this manner, the lighting plan development system can assist the user implement a lighting plan according to a particular strategy by automatically selecting the types of lighting elements that fit the particular strategy selected by the user.

An embodiment includes a feature for exporting a dataset (e.g., lamp specifications, locations, and map data) that can be used to define a complete lighting plan, meaning both the inventory of lamps used in the plan and the placement of the lamps in a mapped location. The content of this lighting plan can include a map and an imported lamp inventory. The imported lamp inventory can be stored in the database 150. The generated lighting plan can also be stored in the database 150. Alternatively, the data can be stored in a combined form.

Figure 17:
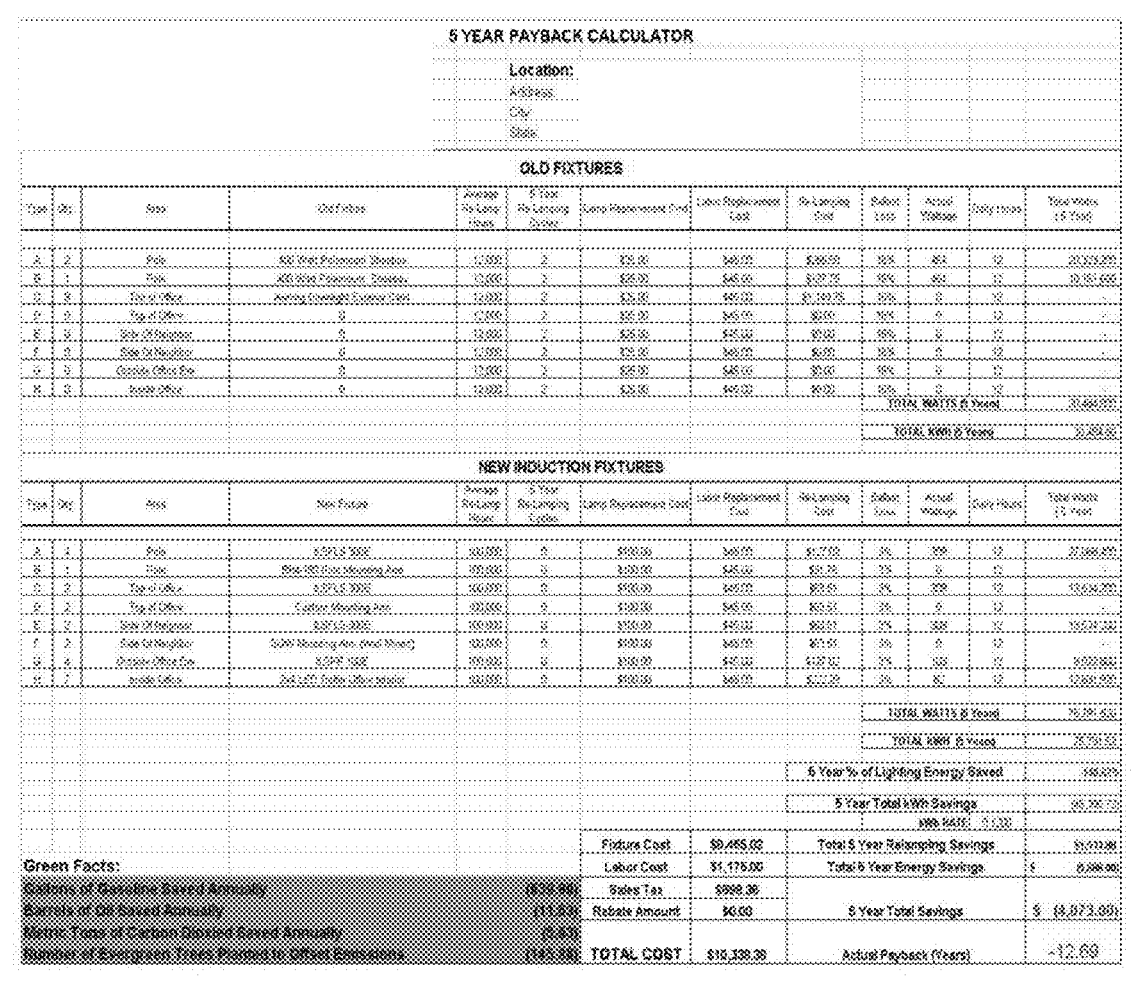

Referring to FIG. 17, an example portion of a lighting plan proposal or spreadsheet produced by the lighting plan development system of an example embodiment is shown. The spreadsheet portion of the lighting plan proposal can be exported from the lighting plan development system by the lighting plan data exporter 260. The rows in the spreadsheet represent each of the lighting elements in a particular lighting plan. The columns in this spreadsheet example represent each of a variety of attributes corresponding to each of the lighting elements in the particular lighting plan. The automatically generated lighting plan proposal can be readily posted, emailed, or otherwise electronically communicated to various recipients.

Figure 18:
FIG. 18 illustrates an example embodiment of a lighting simulation for various types of lighting elements.

FIG. 18 illustrates an example embodiment of a lighting simulation for various types of lighting elements. As shown, the specifications of particular lighting elements can be used to define a lighting pattern or lighted area that would be illuminated by a particular lighting element. FIG. 18 shows a sample overlay area 1800 that defines a particular region of interest. As described above, this region of interest can be displayed in combination with a map or photograph of the particular geographical location corresponding to the region of interest. As also described above, various lighting elements 1802 can be added to the overlay area 1800 at various positions by the user. In the example embodiment, lighting patterns 1804 for each lighting element can be automatically generated and displayed based on the type of lighting element selected by the user and position of the lighting element as specified by the user. The specifications for a particular lighting element can be used to automatically generate and display a lighting pattern 1804 associated with the particular lighting element. For example, brighter lighting elements would be expected to cast a larger lighting pattern 1804. Less powerful lighting elements would be expected to cast a smaller lighting pattern 1804. The height of a particular lighting element would also affect the shape and size of the lighting pattern 1804. Some lighting elements can produce directional lighting patterns 1804 that are non-circular (e.g., oval). Other lighting elements can produce colored light that can be simulated in the particular lighting patterns 1804 that are displayed for a particular lighting element. Examples of each of these types of lighting patterns 1804 are shown in FIG. 18.

In the manner described above, lighting patterns 1804 can be automatically generated for each of the lighting elements specified by a user or automatically determined by the lighting plan development system as described above. The lighting patterns 1804 correspond to a simulation of the operation of particular lighting elements. Once the lighting patterns 1804 are automatically generated for each lighting element and projected on the overlay area 1800, the lighting plan development system can automatically determine if the overlay area 1800 (and thus the corresponding regions of interest) is fully covered by the lighting elements selected by the user. If there are portions of the region of interest not covered by the user-selected lighting elements, the lighting plan development system can automatically: 1) move the positions of the lighting elements to maximize coverage, and/or 2) substitute different types of lighting elements for the user selected lighting elements to maximize coverage of the region of interest. In this manner, the lighting plan development system can use the simulations of the lighting elements (as indicated via the lighting patterns 1804) to assist the user in defining a lighting plan that best suits a particular region of interest.

Figure 19:
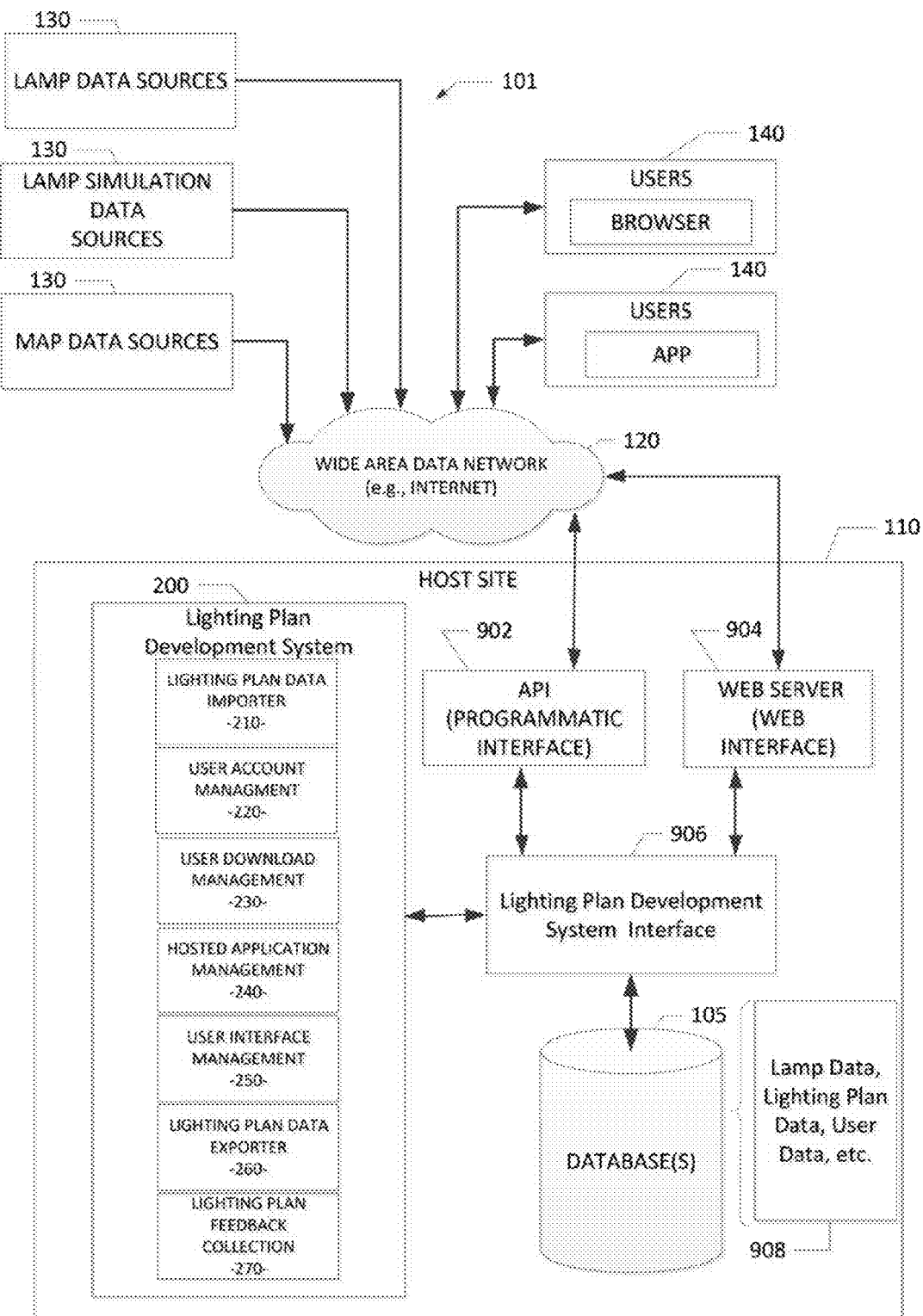
FIG. 19 illustrates another example embodiment of a networked system in which various embodiments may operate.

Referring now to FIG. 19, another example embodiment 101 of a networked system in which various embodiments may operate is illustrated. In the embodiment illustrated, the host site 110 is shown to include the lighting plan development system 200. The lighting plan development system 200 is shown to include the functional components 210-270, as described above. In a particular embodiment, the host site 110 may also include a web server 904, having a web interface with which users may interact with the host site 110 via a user interface or web interface. The host site 110 may also include an application programming interface (API) 902 with which the host site 110 may interact with other network entities on a programmatic or automated data transfer level. The API 902 and web interface 904 may be configured to interact with the lighting plan development system 200 either directly or via an interface 906. The lighting plan development system 200 may be configured to access a data storage device 105 either directly or via the interface 906.

Figure 20:
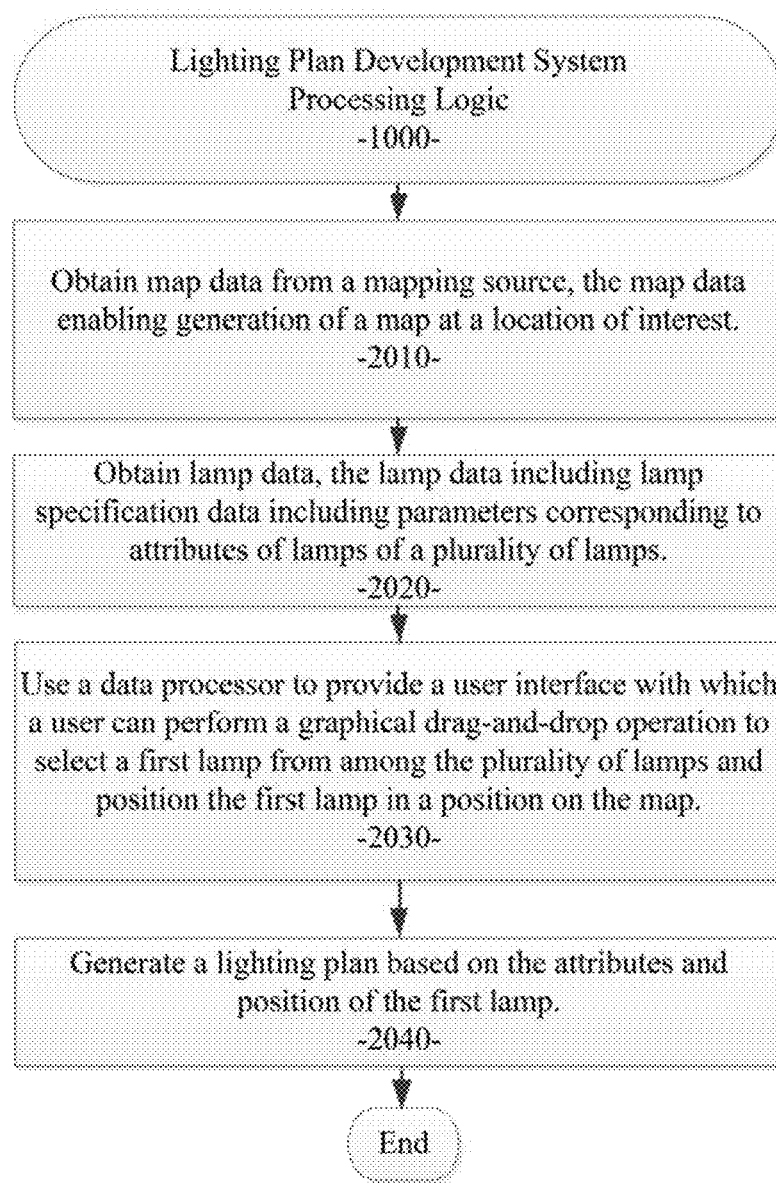
FIGS. 20 through 24 are processing flow charts illustrating an example embodiment of a lighting plan or proposal development method as described herein.

Referring now to FIG. 20, a processing flow diagram illustrates an example embodiment of a lighting plan development system 200 as described herein. The method of an example embodiment includes: obtaining map data from a mapping source, the map data enabling generation of a map at a location of interest (processing block 2010); obtaining lamp data, the lamp data including lamp specification data including parameters corresponding to attributes of lamps of a plurality of lamps (processing block 2020); using a data processor to provide a user interface with which a user can perform a graphical drag-and-drop operation to select a first lamp from among the plurality of lamps and position the first lamp in a position on the map (processing block 2030); and generating a lighting plan based on the attributes and position of the first lamp (processing block 2040).

Figure 21:
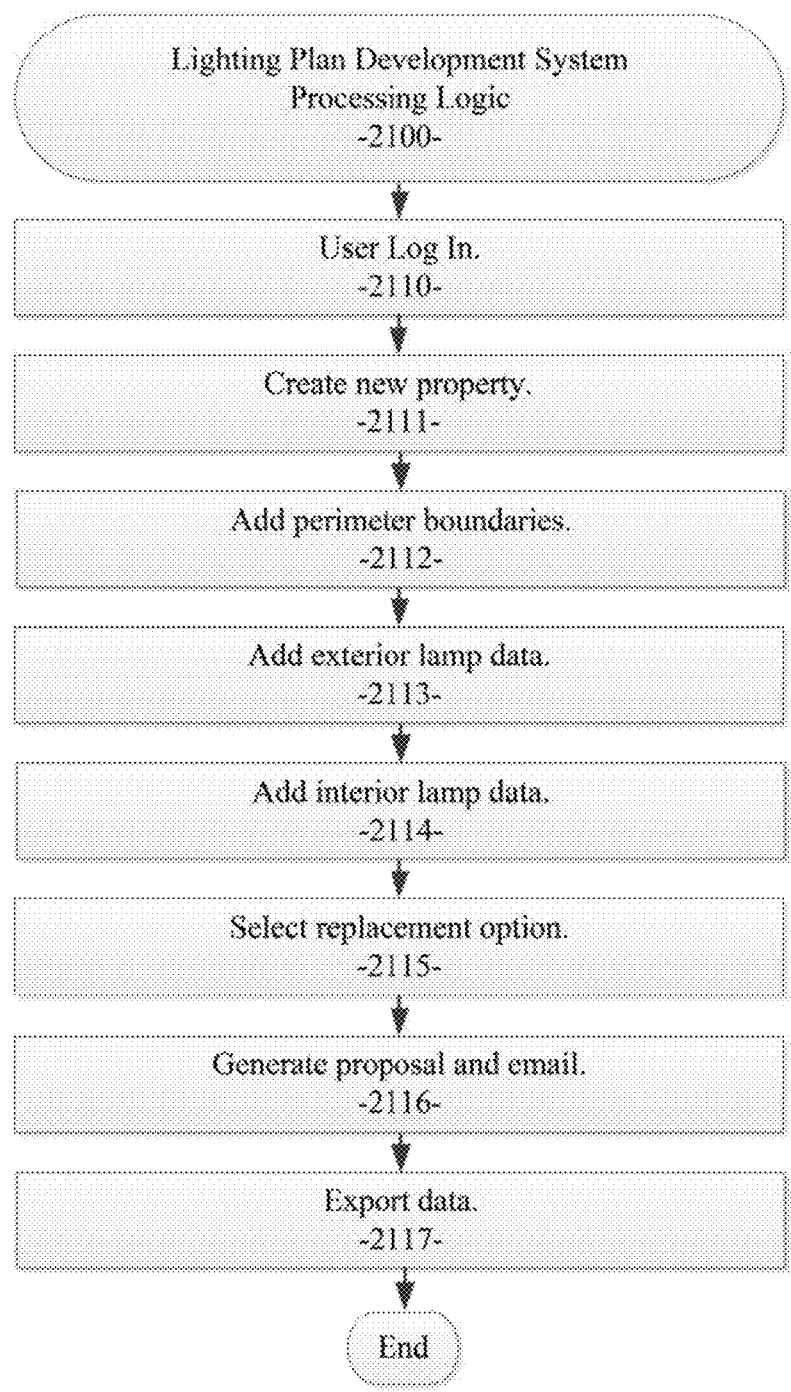

Referring now to FIG. 21, a processing flow diagram illustrates an example embodiment of an overall use case for a lighting plan development system 200 as described herein. The method of an example embodiment includes: enabling the user to log in (processing block 2110); enabling the user to create a new property (processing block 2111); enabling the user to add perimeter boundaries (processing block 2112); enabling the user to add exterior and/or interior lamp data (processing blocks 2113 and 2114); enabling the user to select a replacement option (processing block 2115); the system generates a lighting plan/proposal and emails, or otherwise communicates, the proposal to selected recipients (processing block 2116); and the system can export lighting plan/proposal data to third parties (processing block 2117).

Figure 22:
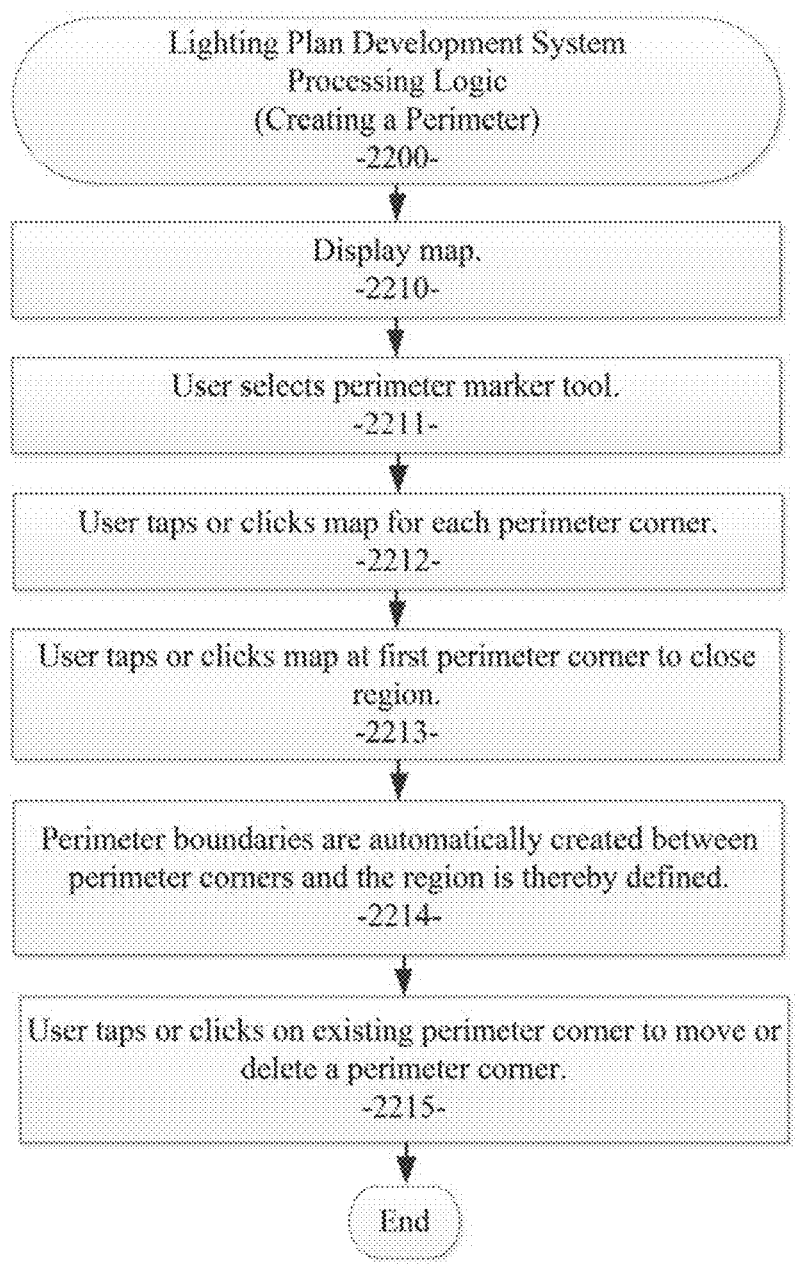

Referring now to FIG. 22, a processing flow diagram illustrates an example embodiment of a use case for creating a perimeter in a lighting plan development system 200 as described herein. The method of an example embodiment includes: the system displays a map (processing block 2210); enabling the user to select a perimeter marker tool (processing block 2211); enabling the user to tap or click the map for each perimeter corner (processing block 2212); enabling the user to tap or click the map at a first perimeter corner to close the region (processing block 2213); the perimeter boundaries are automatically created between perimeter corners and the region is thereby defined (processing block 2214); and enabling the user to tap or click on an existing perimeter corner to move or delete a perimeter corner (processing block 2215).

Figure 23:
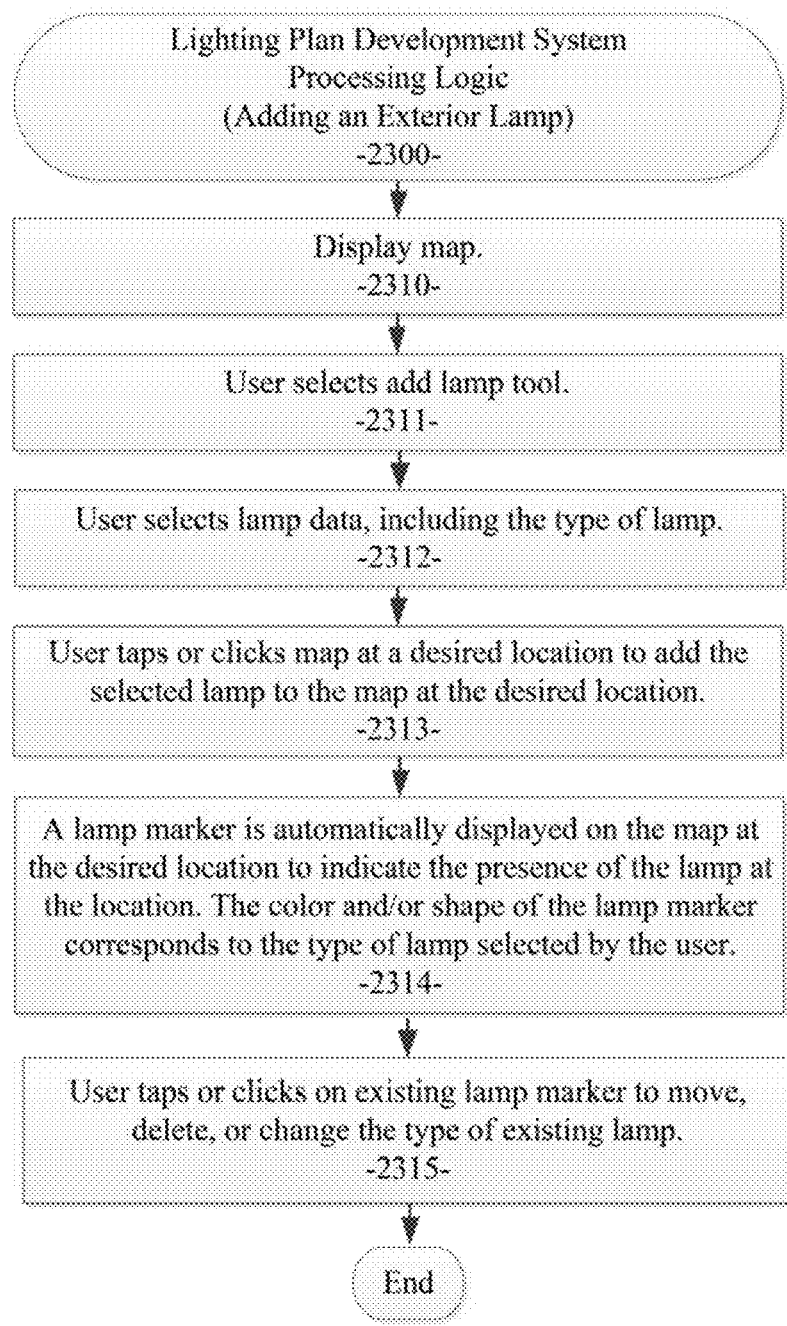

Referring now to FIG. 23, a processing flow diagram illustrates an example embodiment of a use case for adding an exterior lamp in a lighting plan development system 200 as described herein. The method of an example embodiment includes: the system displays a map (processing block 2310); enabling the user to select an add lamp tool (processing block 2311); enabling the user to select lamp data, including the type of lamp (processing block 2312); enabling the user to tap or click the map at a desired location to add the selected lamp to the map at the desired location (processing block 2313); a lamp marker is automatically displayed on the map at the desired location to indicate the presence of the lamp at the location. The color and/or shape of the lamp marker corresponds to the type of lamp selected by the user (processing block 2314); and enabling the user to tap or click on an existing lamp marker to move, delete, or change the type of existing lamp (processing block 2315).

Figure 24:
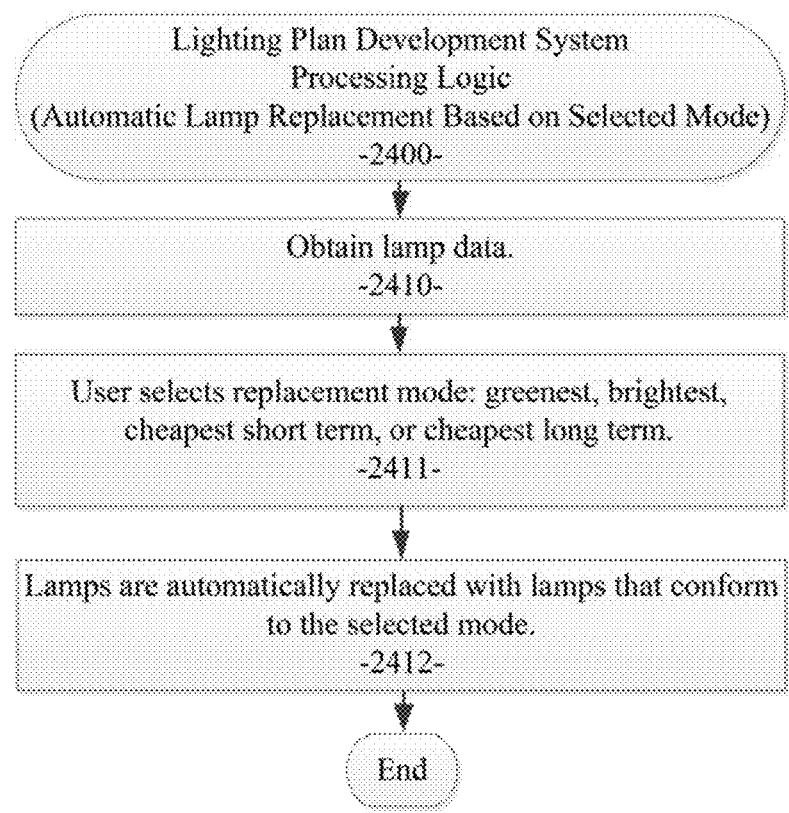

Referring now to FIG. 24, a processing flow diagram illustrates an example embodiment of a use case for automatic lamp replacement based on a selected mode in a lighting plan development system 200 as described herein. The method of an example embodiment includes: obtaining lamp data (processing block 2410); enabling the user to select a replacement mode, including but not limited to: greenest, brightest, cheapest short term, or cheapest long term (processing block 2411); and lamps are automatically replaced with lamps that conform to the selected mode (processing block 2412).

Figure 25:
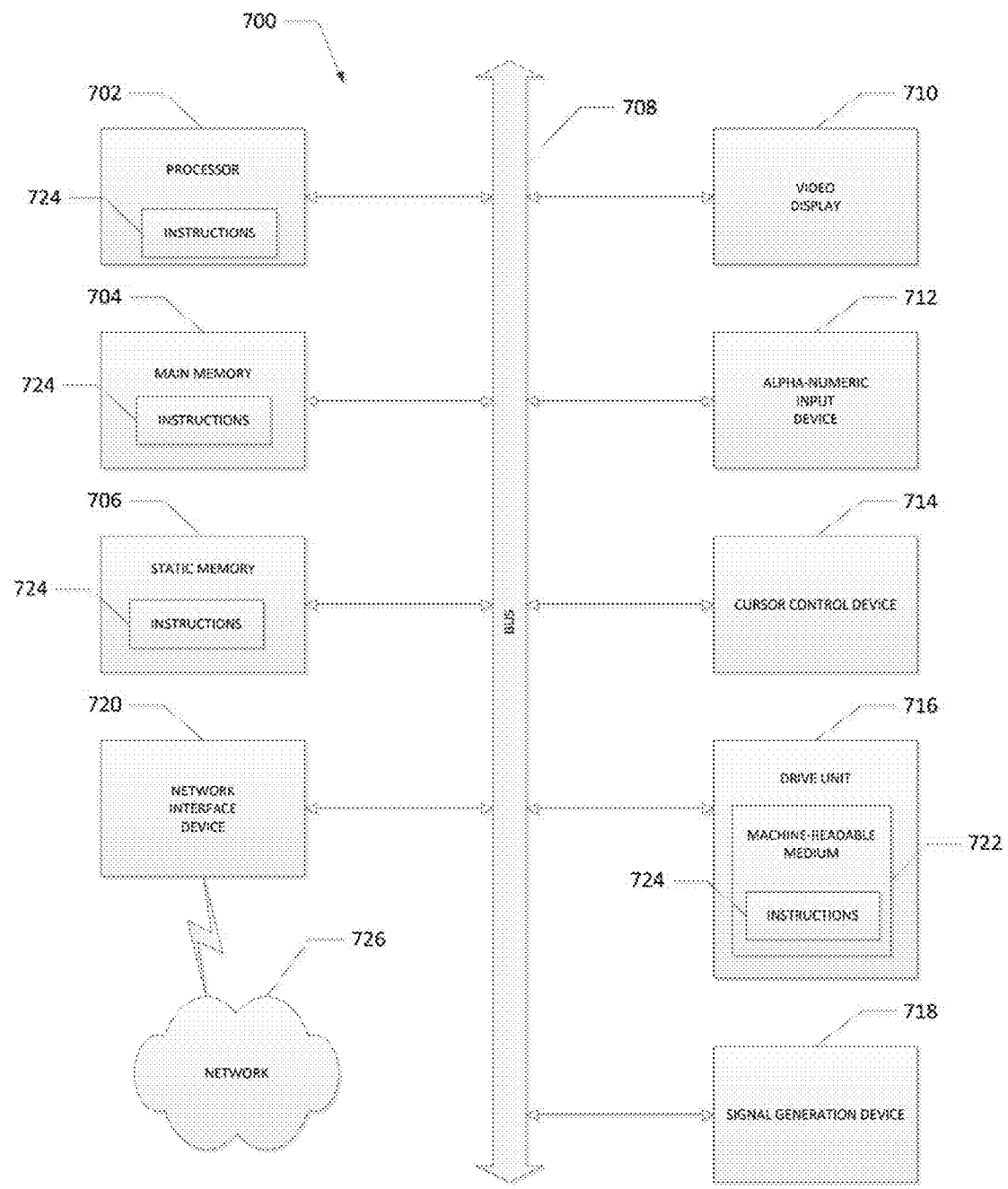
FIG. 25 shows a diagrammatic representation of machine in the example form of a computer system within which a set of instructions when executed may cause the machine to perform any one or more of the methodologies discussed herein.

FIG. 25 shows a diagrammatic representation of a machine in the example form of a computer system 700 within which a set of instructions when executed may cause the machine to perform any one or more of the methodologies discussed herein. In alternative embodiments, the machine operates as a standalone device or may be connected (e.g., networked) to other machines. In a networked deployment, the machine may operate in the capacity of a server or a client machine in server-client network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a network router, switch or bridge, or any machine capable of executing a set of instructions (sequential or otherwise) that specify actions to be taken by that machine. Further, while only a single machine is illustrated, the term "machine" can also be taken to include any collection of machines that individually or jointly execute a set (or multiple sets) of instructions to perform any one or more of the methodologies discussed herein.

The example computer system 700 includes a processor 702 (e.g., a central processing unit (CPU), a graphics processing unit (GPU), or both), a main memory 704 and a static memory 706, which communicate with each other via a bus 708. The computer system 700 may further include a video display unit 710 (e.g., a liquid crystal display (LCD) or a cathode ray tube (CRT)). The computer system 700 also includes an input device 712 (e.g., a keyboard), a cursor control device 714 (e.g., a mouse), a disk drive unit 716, a signal generation device 718 (e.g., a speaker) and a network interface device 720.

The disk drive unit 716 includes a machine-readable medium 722 on which is stored one or more sets of instructions (e.g., software 724) embodying any one or more of the methodologies or functions described herein. The instructions 724 may also reside, completely or at least partially, within the main memory 704, the static memory 706, and/or within the processor 702 during execution thereof by the computer system 700. The main memory 704 and the processor 702 also may constitute machine-readable media. The instructions 724 may further be transmitted or received over a network 726 via the network interface device 720. While the machine-readable medium 722 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" can also be taken to include any medium that is capable of storing, encoding or carrying a set of instructions for execution by the machine and that cause the machine to perform any one or more of the methodologies of the various embodiments, or that is capable of storing, encoding or carrying data structures utilized by or associated with such a set of instructions. The term "machine-readable medium" can accordingly be taken to include, but not be limited to, solid-state memories, optical media, and magnetic media.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A computer-implemented method comprising:
    obtaining map data from a mapping source, the map data enabling generation of a map representing physical locations at a location of interest;
    obtaining lamp data, the lamp data including lamp specification data including parameters corresponding to attributes of lamps of a plurality of lamps;
    using a data processor to provide a user interface with which a user can perform a graphical drag-and-drop operation to select a first lamp from among the plurality of lamps and position the first lamp in a location on the map, the location on the map corresponding to a physical position location of the first lamp at the location of interest;
    moving the location of the first lamp on the map to a different location on the map by use of the graphical drag-and-drop operation of the user interface, the different location of the first lamp on the map corresponding to a different physical location of the first lamp at the location of interest, the movement of the location of the first lamp on the map enabling creation of a simulation to generate one or more lighting patterns at the location of interest; and
    generating and outputting a lighting plan based on the attributes of the first lamp, the location of the first lamp at the location of interest, and the simulation, the lighting plan including information indicative of a cost of implementing the lighting plan at the location of interest, wherein generating the lighting plan further includes using one or more mode signals to a lighting plan development module such that one or more lighting elements is automatically positioned or substituted on the map to generate the lighting plan based on the one or more mode signals.

2. The method as claimed in claim 1 wherein the map data is obtained from Google Maps.

3. The method as claimed in claim 1 including providing a drawing tool set to enable a user to draw an overlay region to specify a particular area in a mapped location.

4. The method as claimed in claim 1 wherein the map data includes a photographic image of a region of interest.

5. The method as claimed in claim 1 including a network-accessible database for storage of the lamp specification data, lamp simulation data, and a plurality of lighting plans.

6. The method as claimed in claim 1 including selecting the first lamp and automatically displaying lamp specification data corresponding to the selected first lamp.

7. The method as claimed in claim 1 wherein the user interface is provided on a client device from the group: a personal computer, a mobile communication device, and a tablet computer.

8. The method as claimed in claim 1 including providing the lighting plan based on one of a plurality of user-selectable modes, including, but not limited to: current, greenest, brightest, cheapest short term, and cheapest long term.

9. The method as claimed in claim 1 including using lighting element specification data to generate a simulation of a lighting element, the simulation including generation of a lighting pattern corresponding to a particular type of lighting element.

10. A system, comprising:
    a processor;
    a database, in data communication with the processor, for storage of the lamp data including lamp specification data including parameters corresponding to attributes of lamps of a plurality of lamps; and
    a lighting plan development module, executable by the processor, to:
    obtain map data from a mapping source, the map data enabling generation of a map representing physical locations at a location of interest;
    obtain the lamp data;
    use the processor to provide a user interface with which a user can perform a graphical drag-and-drop operation to select a first lamp from among the plurality of lamps and position the first lamp in a location on the map, the location on the map corresponding to a physical position location of the first lamp at the location of interest;
    move the location of the first lamp on the map to a different location on the map by use of the graphical drag-and-drop operation of the user interface, the different location of the first lamp on the map corresponding to a different physical location of the first lamp at the location of interest, the movement of the location of the first lamp on the map enabling creation of a simulation to generate one or more lighting patterns of lighting at the location of interest; and
    generate and outputting a lighting plan based on the attributes of the first lamp, the location of the first lamp at the location of interest, and the simulation, the lighting plan including information indicative of a cost of implementing the lighting plan at the location of interest, wherein generating the lighting plan further includes using one or more mode signals to the lighting plan development module such that one or more lighting elements is automatically positioned or substituted on the map to generate the lighting plan based on the one or more mode signals.

11. The system as claimed in claim 10 wherein the map data is obtained from Google Maps.

12. The system as claimed in claim 10 being further configured to provide a drawing tool set to enable a user to draw an overlay region to specify a particular area in a mapped location.

13. The system as claimed in claim 10 wherein the map data includes a photographic image of a region of interest.

14. The system as claimed in claim 10 being further configured to provide a network-accessible database for storage of the lamp specification data, lamp simulation data, and a plurality of lighting plans.

15. The system as claimed in claim 10 being further configured to select the first lamp and automatically displaying lamp specification data corresponding to the selected first lamp.

16. The system as claimed in claim 10 wherein the user interface is provided on a client device from the group: a personal computer, a mobile communication device, and a tablet computer.

17. The system as claimed in claim 10 being further configured to provide the lighting plan based on one of a plurality of user-selectable modes, including, but not limited to: current, greenest, brightest, cheapest short term, and cheapest long term.

18. The system as claimed in claim 10 being further configured to use lighting element specification data to generate a simulation of a lighting element, the simulation including generation of a lighting pattern corresponding to a particular type of lighting element.

19. A non-transitory machine-useable storage medium embodying instructions which, when executed by a machine, cause the machine to:
obtain map data from a mapping source, the map data enabling generation of a map representing physical locations at a location of interest;
obtain lamp data, the lamp data including lamp specification data including parameters corresponding to attributes of lamps of a plurality of lamps;
use a data processor to provide a user interface with which a user can perform a graphical drag-and-drop operation to select a first lamp from among the plurality of lamps and position the first lamp in a location on the map, the location on the map corresponding to a physical location of the first lamp at the location of interest;
move the location of the first lamp on the map to a different location on the map by use of the graphical drag-and-drop operation of the user interface, the different location of the first lamp on the map corresponding to a different physical location of the first lamp at the location of interest, the movement of the location of the first lamp on the map enabling creation of a simulation to generate one or more lighting patterns at the location of interest; and
generate and outputting a lighting plan based on the attributes and position of the first lamp, the location of the first lamp at the location of interest, and the simulation, the lighting plan including information indicative of a cost of implementing the lighting plan at the location of interest, wherein generating the lighting plan further includes using one or more mode signals to a lighting plan development module such that one or more lighting elements is automatically positioned or substituted on the map to generate the lighting plan based on the one or more mode signals.

20. The non-transitory machine-useable storage medium as claimed in claim 19 wherein the user interface is provided on a client device from the group: a personal computer, a mobile communication device, and a tablet computer.

21. The non-transitory machine-useable storage medium as claimed in claim 19 wherein the first lamp is positioned on the map using geo-coordinates automatically obtained using a global positioning system (GPS).

\* \* \* \* \*